(12) United States Patent
Ogasawara

(10) Patent No.: US 10,784,081 B2
(45) Date of Patent: Sep. 22, 2020

(54) CHARGED PARTICLE BEAM LITHOGRAPHY APPARATUS AND CHARGED PARTICLE BEAM PATTERN WRITING METHOD

(71) Applicant: NuFlare Technology, Inc., Yokohama-shi (JP)

(72) Inventor: Munehiro Ogasawara, Hiratsuka (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 16/854,405

(22) Filed: Apr. 21, 2020

(65) Prior Publication Data

US 2020/0266033 A1 Aug. 20, 2020

Related U.S. Application Data

(62) Division of application No. 16/228,824, filed on Dec. 21, 2018.

(30) Foreign Application Priority Data

Dec. 26, 2017 (JP) .................................. 2017-249436

(51) Int. Cl.
*H01J 37/317* (2006.01)
*H01J 37/30* (2006.01)
(Continued)

(52) U.S. Cl.
CPC .......... *H01J 37/3177* (2013.01); *H01J 37/06* (2013.01); *H01J 37/12* (2013.01); *H01J 37/147* (2013.01);
(Continued)

(58) Field of Classification Search
USPC .................................................... 250/492.22
See application file for complete search history.

(56) References Cited

U.S. PATENT DOCUMENTS

| 8,878,143 B2 | 11/2014 | Yasuda | |
|---|---|---|---|
| 2002/0109090 A1* | 8/2002 | Nakasuji | H01J 37/222 250/311 |
| 2017/0301506 A1 | 10/2017 | Matsumoto | |

FOREIGN PATENT DOCUMENTS

| JP | 7-192682 | 7/1995 |
|---|---|---|
| JP | 2013-93567 | 5/2013 |

* cited by examiner

*Primary Examiner* — Kiet T Nguyen
(74) *Attorney, Agent, or Firm* — Oblon, McClelland, Maier & Neustadt, L.L.P.

(57) ABSTRACT

A charged particle beam lithography apparatus, includes a plurality of multiple-beam sets, each of which including a plurality of irradiation sources each generating an independent charged particle beam, a plurality of objective deflectors, each arranged for a corresponding charged particle beam, and configured to deflect the corresponding charged particle beam to a desired position on a substrate, and a plurality of electrostatic or electromagnetic lens fields each to focus the corresponding charged particle beam on the target object; a plurality of common deflection amplifiers, arranged for each multiple-beam set, and each of the plurality of common deflection amplifiers being configured to commonly control the plurality of objective deflectors arranged in a same multiple-beam set; a plurality of individual ON/OFF mechanisms configured to individually turn ON/OFF a beam irradiated from each irradiation source; and one or more multiple-beam clusters including the plurality of multiple-beam sets.

2 Claims, 19 Drawing Sheets

(51) Int. Cl.
*H01J 37/06* (2006.01)
*H01J 37/12* (2006.01)
*H01J 37/147* (2006.01)

(52) U.S. Cl.
CPC ... *H01J 37/3007* (2013.01); *H01J 2237/0437* (2013.01); *H01J 2237/1504* (2013.01); *H01J 2237/31761* (2013.01); *H01J 2237/31762* (2013.01); *H01J 2237/31774* (2013.01); *H01J 2237/31779* (2013.01); *H01J 2237/31781* (2013.01)

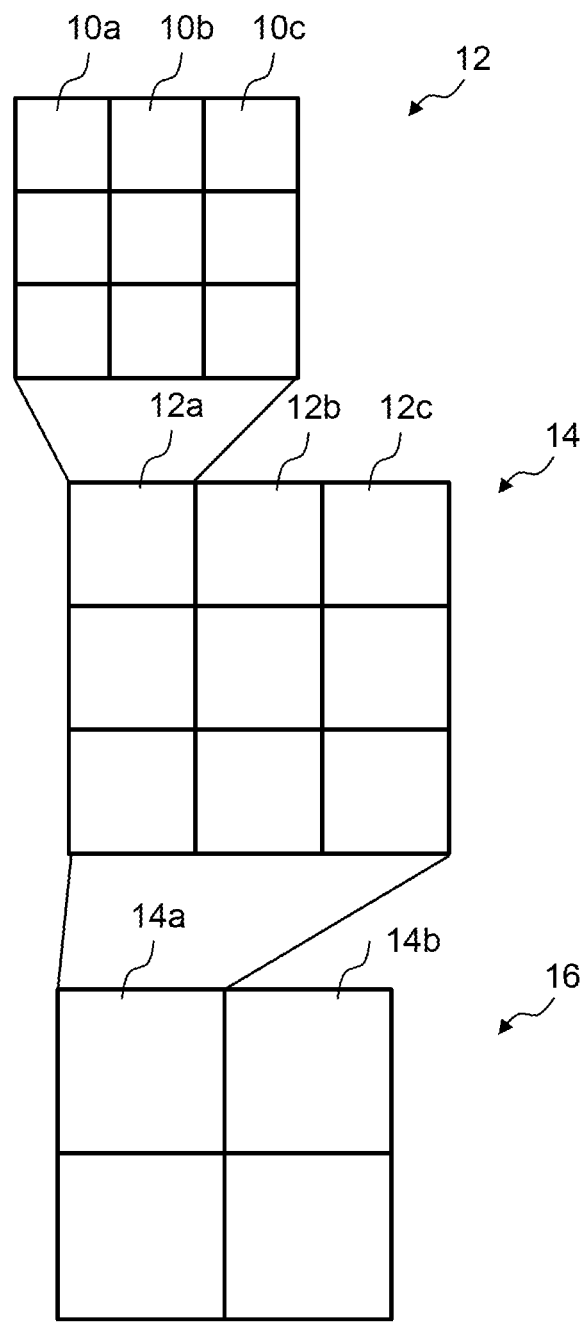
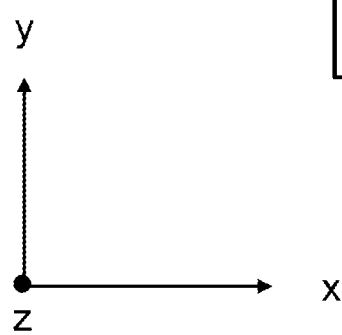

CHARGED PARTICLE BEAM LITHOGRAPHY APPARATUS AND CHARGED PARTICLE BEAM PATTERN WRITING METHOD

CROSS-REFERENCE TO RELATED APPLICATION

This application is a Divisional of U.S. application Ser. No. 16/228,824 filed Dec. 21, 2018, which is based upon and claims the benefit of priority from prior Japanese Patent Application No. 2017-249436 filed on Dec. 26, 2017 in Japan, the entire contents of each of which are incorporated herein by reference.

BACKGROUND OF THE INVENTION

Field of the Invention

Embodiments described herein relate generally to a charged particle beam lithography apparatus and a charged particle beam pattern writing method and relates to, for example, a method of writing a pattern directly on a wafer using multiple beams.

Related Art

A lithography technique which leads development of micropatterning of a semiconductor device is a very important process for exclusively generating a pattern in semiconductor manufacturing processes. In recent years, with an increase in integration density of an LSI, a circuit line width required for semiconductor devices is getting smaller year by year. Here, the electron beam pattern writing technique has inherently excellent resolution, and a pattern is directly written onto a semiconductor wafer using an electron beam without going through a mask for exposure.

Further, if the exposure area of a target object is S, the resist sensitivity is d, and the beam average current is Ib, the pattern writing time Ttot is given by Ttot=Sd/Ib+Tne if a useless time Tne such as the movement time of a beam is excluded. That is, in order to shorten the exposure time, it is clear that the beam average current Ib needs to be increased and/or the useless time Tne needs to be shortened.

In the variable shaped beam system mainly used in the conventional electron beam writing, the current density is not dependent on the beam size in general, so that the beam size becomes small as the pattern becomes finer and thus, the beam average current Ib becomes smaller. In addition, the time Tne required for moving a beam increases. Therefore, it is difficult to shorten Ttot.

As a system of shortening the time Tne and increasing the average beam current Ib, for example, a lithography apparatus using multiple beams is known. Compared with the case in which one electron beam is used to write a pattern, more beams can be irradiated at a time by using multiple beams and so the beam average current Ib can be increased regardless of the pattern, and also many beams are deflected at a time and so an increase of the time Tne can be suppressed and therefore, throughput can be improved significantly. In such a lithography apparatus of multiple-beam mode, for example, an electron beam emitted from an electron gun assembly is passed through a mask having a plurality of holes to form multiple beams, each beam is subjected to blanking control, each beam that is not shielded is reduced by an optical system, and multiple beams as a whole are collectively deflected by a common deflector before being shot at a desired position on a target object.

In such a multiple-beam pattern writing apparatus, one beam emitted from one irradiation source is divided into multiple beams and thus, there is a limit to increasing the amount of beam current in multiple beams as a whole. Therefore, further improvements in throughput are limited.

Also, a lithography apparatus using a multi-column that combines electron beam columns, each including an electron gun assembly, a lens, and a deflector and serving one electron beam has been studied. In such a multi-column lithography apparatus, each column takes charge of one of a plurality of dies (chips) of the same pattern formed on a semiconductor wafer for pattern writing. In the multi-column lithography apparatus, each beam is emitted by an individual electron gun assembly and thus, it may be possible to increase the amount of current. However, in the multi-column lithography apparatus, individual columns are controlled independently and thus, the number of deflection amplifiers of the deflector also increases accordingly. When one deflector is constructed of, for example, eight electrodes, eight deflection amplifiers are required for each beam. Thus, when, for example, 2000 beams are irradiated at a time as multiple beams, 16,000 deflection amplifiers are required and the control of 16000 deflection amplifiers is required. Therefore, practically, there is a limit to the number of beams that can be mounted, and it becomes difficult to fully demonstrate the unique performance of multiple-beam pattern writing such as improvement of pattern writing throughput. Even if additional columns can be added, the number of beams is limited because the number equal to the number of dies (chips) formed on one wafer becomes the upper limit and so the number of beams is limited and there is a limit to the mass production of semiconductor wafers.

In contrast, a lithography apparatus in which beams are emitted from each of a plurality of electron gun assemblies to form multiple beams as many as the number of electron gun assemblies and the multiple beams as a whole are collectively focused and deflected by a common electron optics to irradiate a desired position on a target object with the multiple beams is also proposed (see Published Unexamined Japanese Patent Application No. 07-192682 (JP-A-07-192682), for example). In such a configuration, each beam is emitted by an individual electron gun assembly so that the amount of current can be increased. However, the diameter size of the whole beam becomes large and so the electrode used for the deflector becomes large. Therefore, the number of beams that can be mounted is limited and the mass production of semiconductor wafers is still limited.

BRIEF SUMMARY OF THE INVENTION

According to one aspect of the present invention, a charged particle beam lithography apparatus, includes:
  a plurality of multiple-beam sets, each of which including
    a plurality of irradiation sources each generating an independent charged particle beam,
    a plurality of objective deflectors, each arranged for a corresponding charged particle beam, and configured to deflect the corresponding charged particle beam to a desired position on a substrate as a target object, and
    a plurality of electrostatic or electromagnetic lens fields each to focus the corresponding charged particle beam on the target object;
  a plurality of common deflection amplifiers, arranged for each of the plurality of multiple-beam sets, and each of the plurality of common deflection amplifiers being configured to commonly control the plurality of objective deflectors arranged in a same multiple-beam set;

a plurality of individual ON/OFF mechanisms configured to individually turn ON/OFF a beam irradiated from each of the plurality of irradiation sources; and one or more multiple-beam clusters including the plurality of multiple-beam sets.

According to another aspect of the present invention, a charged particle beam pattern writing method includes:

continuously moving a plurality of substrates aligned in a predetermined direction in the predetermined direction; and writing a pattern on the plurality of substrates by using a plurality of multiple-beam sets, each irradiating multiple beams, so that each multiple-beam set of the plurality of multiple-beam sets sequentially writes a portion of the pattern on a different one or more of exposure pixel groups in a same small region, on a same substrate, smaller than each die region of a plurality of die regions to form a same pattern, the plurality of die regions provided on each substrate of the plurality of substrates, in a state where the plurality of substrates is continuously moved in the predetermined direction.

BRIEF DESCRIPTION OF THE DRAWINGS

FIGS. 2A to 2C are diagrams showing an example of a system configuration of a multiple-beam cluster according to the first embodiment;

DETAILED DESCRIPTION OF THE INVENTION

Hereinafter, in an embodiment, a lithography apparatus and a method capable of improving the throughput of multiple-beam pattern writing and mass-producing semiconductor substrates will be described.

In Embodiment described below, the configuration using an electron beam will be described as an example of a charged particle beam. However, the charged particle beam is not limited to an electron beam, and a beam such as an ion beam using charged particles may also be used.

First Embodiment

Figure 1:
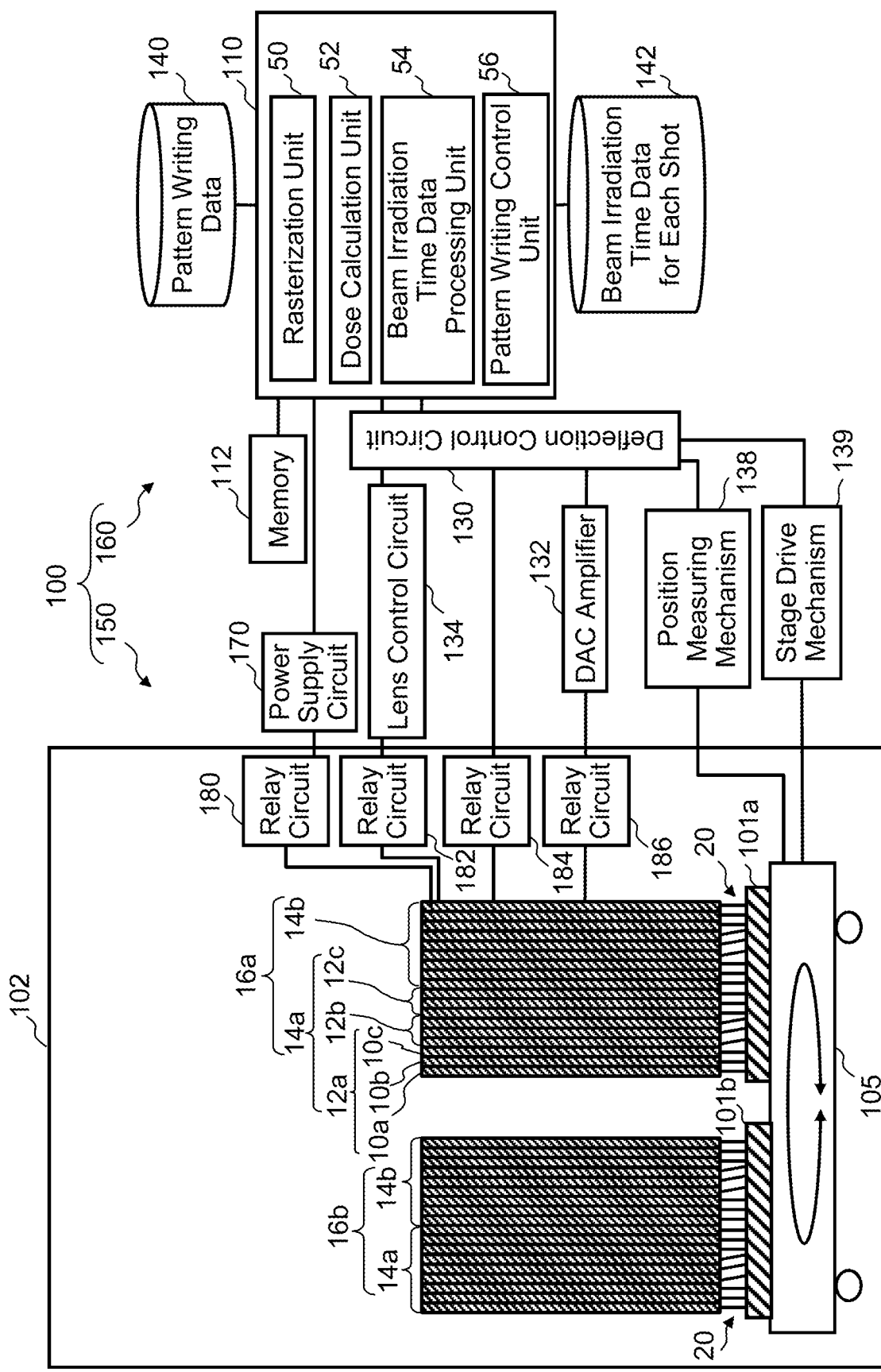
FIG. 1 is a conceptual diagram showing the configuration of a lithography apparatus according to a first embodiment.

FIG. 1 is a conceptual diagram showing the configuration of a lithography apparatus according to a first embodiment. In FIG. 1, a lithography apparatus 100 includes a pattern writing mechanism 150 and a control system circuit 160. The lithography apparatus 100 is an example of the charged particle beam lithography apparatus. The pattern writing mechanism 150 includes a pattern writing chamber 102. In the pattern writing chamber 102, a plurality of multiple-beam clusters 16 and a stage 105 are arranged. In the example of FIG. 1, the case where the plurality of multiple-beam clusters 16 is arranged is shown, but the present embodiment is not limited to this and one or more multiple-beam clusters 16 may be arranged. In an upper portion of the stage 105, for example, a plurality of electrostatic chucks for fixing a substrate 101 is provided. By the operation of a transport system (not shown), the substrate 101 is transported onto the stage 105 or taken out from the stage 105 to the outside. By such an operation, a plurality of substrates 101 on which a pattern is to be written is arranged on the stage 105 with the surface on which a pattern is to be written directed upward. The position of the stage 105 is measured by a position measuring mechanism 138 such as a laser interferometer or a linear scale to measure the position of each of the substrates 101. The position of each of the substrates 101 can be obtained relative to the stage position to be measured. It is desirable to provide a plurality of such position measuring means. A plurality of measuring means in the y direction is provided when the stage moving direction for pattern writing is the x direction. The wafer position in the y direction in each multiple-beam set 12 is estimated from the outputs of a plurality of y direction measuring means and the value and the estimated value of the wafer position in the x direction are used for stage tracking. Each of the multiple-beam clusters 16 is constructed of one or more multiple-beam blocks 14. Each of the multiple-beam blocks 14 is constructed of a plurality of multiple-beam sets 12. In other words, the multiple-beam cluster 16 is constructed of a plurality of multiple-beam sets 12. The multiple-beam set 12 is a kind of multiple-beam column. An electron beam column 10 is defined as a unit having an electron source, a lens mechanism for converging and focusing an electron beam emitted from the electron source on the surface of the substrate 101, and an objective deflector. The lens mechanism in the electron beam column 10 unit includes a case where the lens mechanism is a portion of a lens array in which a plurality of lenses is arranged. The lens mechanism forms an electrostatic or electromagnetic lens field for focusing an electron beam on the target object surface. Each of the multiple-beam sets 12 has a plurality of electron beam columns 10 and is defined as being configured such that a common deflector drive input signal is input into each objective deflector in the same multiple-beam set 12 and each objective deflector is driven by a common deflector drive electric field or current. Further, in the multiple-beam set 12, each of the electron beam columns 10 belonging to the multiple-beam set 12 is attached to a common mechanical fixing means. In other words, each of the plurality of multiple-beam sets 12 includes a plurality of irradiation sources each generating an independent electron beam and a plurality of objective deflectors each arranged for a corresponding electron beam to deflect the corresponding electron beam to a desired position on the substrate as a target object. Further, the each of the plurality of multiple-beam sets 12 includes a plurality of electrostatic or electromagnetic lens fields each to focusing the corresponding electron beam on the target object. The multiple-beam cluster 16, the multiple-beam block 14, and the multiple-beam set 12 are examples of the multi-columns. As the substrate 101, for example, a semiconductor substrate (semiconductor wafer) coated with a resist, a mask substrate to which a resist is applied for transferring a mask pattern to a semiconductor wafer or the like is used. Further, the pattern writing chamber 102 is evacuated by a vacuum pump (not shown) and is controlled to have a vacuum environment lower than the atmospheric pressure. The evacuation of an electron optical barrel is performed in units of the multiple-beam cluster 16 and if the evacuation of a target object chamber storing the stage 105 on which a plurality of substrates 101 is placed is carried out collectively in the entire system, the system can be made smaller than when the evacuation is carried out collectively in the entire electron optics.

The control system circuit 160 includes a control computer 110, a memory 112, a deflection control circuit 130, a digital/analog conversion (DAC) amplifier 132, a lens control circuit 134, a stage drive circuit 139, a power supply circuit 170, relay circuits 180, 182, 184, 186, and storage devices 140, 142 such as a magnetic disk drive. The control computer 110, the memory 112, the deflection control circuit 130, the lens control circuit 134, the stage drive circuit 139, the power supply circuit 170, and the storage devices 140, 142 are connected to each other via a bus (not shown). The DAC amplifier 132 and the relay circuit 184 are connected to the deflection control circuit 130. The output of the DAC amplifier 132 is connected to the relay circuit 186. The power supply circuit 170 is connected to the relay circuit 180. The lens control circuit 134 is connected to the relay circuit 182. In FIG. 1, only one DAC amplifier 132 and one relay circuit 186 are shown, but as many circuits as the number obtained by multiplying the number of electrodes of the deflector described below by the number of the multiple-beam sets 12 are arranged. Similarly, though only one relay circuit of each relay circuit 180, 182, 184 is shown in FIG. 1, each relay circuit 180, 182, 184 is suitably arranged for each of the multiple-beam sets 12, for example. Each relay circuit 180, 182, 184, 186 is suitably arranged in the pattern writing chamber 102. The other control system circuits 160 may be arranged in a control chamber (not shown). The stage drive circuit 139 moves the stage 105.

In the control computer 110, a rasterization unit 50, a dose calculation unit 52, a beam irradiation time data processing unit 54, and a pattern writing control unit 56 are arranged. Each " . . . unit" such as the rasterization unit 50, the dose calculation unit 52, the beam irradiation time data processing unit 54, and the pattern writing control unit 56 has a processing circuit. Such processing circuits include, for example, electric circuits, computers, processors, circuit substrates, quantum circuits, or semiconductor devices. Each " . . . unit" may use a common processing circuit (the same processing circuit) or different processing circuits (separate processing circuits). Information input into or output from the rasterization unit 50, the dose calculation unit 52, the beam irradiation time data processing unit 54, and the pattern writing control unit 56 and information during operation are stored in the memory 112 each time.

In addition, pattern writing data is input from outside the lithography apparatus 100 and stored in the storage device 140. Normally, information on a plurality of graphic patterns to be written is defined in the pattern writing data. More specifically, a graphic code, coordinates, size and the like are defined for each graphic pattern. Alternatively, a graphic code, each vertex coordinate and the like are defined for each graphic pattern.

Here, in FIG. 1, only the configuration needed to describe the first embodiment is shown. Other configurations normally needed for the lithography apparatus 100 may also be included.

FIGS. 2A to 2C are diagrams showing an example of a system configuration of a multiple-beam cluster according to the first embodiment. In the example of FIG. 2A, one multiple-beam set 12 is formed of 3×3 electron beam columns 10a, 10b, 10c, . . . arranged in the x and y directions (lengthwise and crosswise). In each of the electron beam columns 10, for example, a cylindrical column (electron optical barrel) is arranged in a frame having a square cross section. Then, in the multiple-beam set 12, the 3×3 electron beam columns 10a, 10b, 10c, . . . are suitably configured to be put together and fitted into a frame (not shown) to be unitized. Then, in the example of FIG. 2B, one multiple-beam block 14 is constructed of 3×3 multiple-beam sets 12a, 12b, 12c, . . . arranged in the x and y directions (lengthwise and crosswise). In the multiple-beam block 14, these 3×3 multiple-beam sets 12a, b, c, . . . are suitably configured to be put together and fitted into a frame (not shown) to be unitized. In the example of FIG. 2C, one multiple-beam cluster 16 is constructed of 2×2 multiple-beam blocks 14a, 14b, arranged in the x and y directions (lengthwise and crosswise). In the multiple-beam cluster 16, it is preferable that these 2×2 multiple-beam blocks 14a, 14b, . . . are suitably configured to be put together and fitted into a frame (not shown) to be unitized. In the example of FIGS. 2A to 2C, it is possible to irradiate 324 multiple beams by one multiple-beam cluster 16. The system configuration of the multiple-beam cluster 16 is not limited thereto.

It is also suitable to provide a reflection electron detector or a Z sensor mechanism using an optical lever in the frame. In addition, a water cooling pipe for temperature adjustment may also be provided in the frame.

Figure 3:
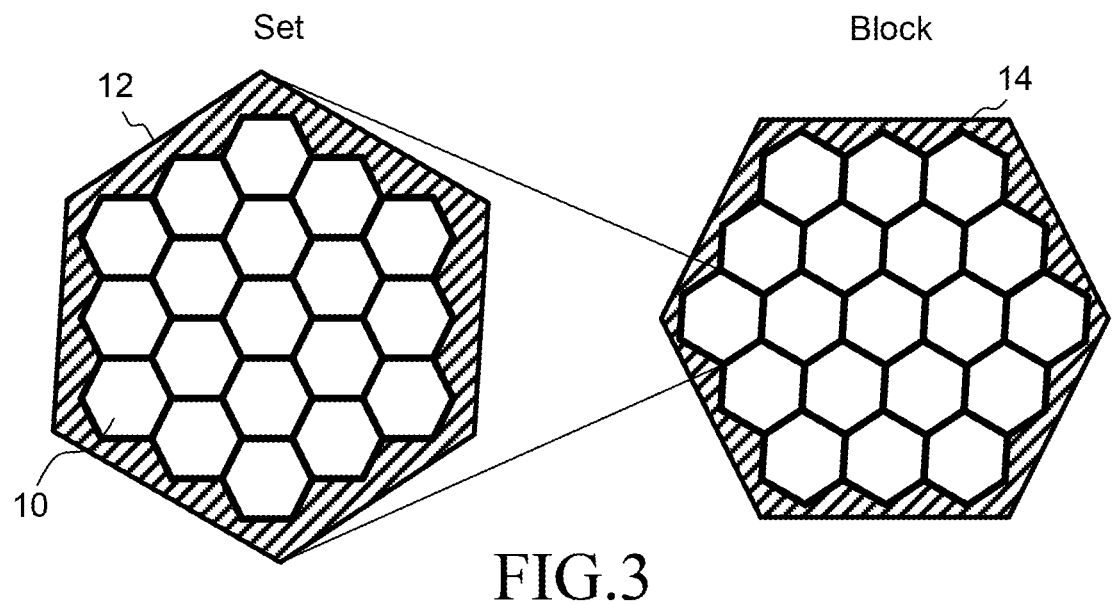
FIG. 3 is a diagram showing another example of the system configuration of a multiple-beam block according to the first embodiment.

FIG. 3 is a diagram showing another example of the system configuration of a multiple-beam block according to the first embodiment.

Figure 4:
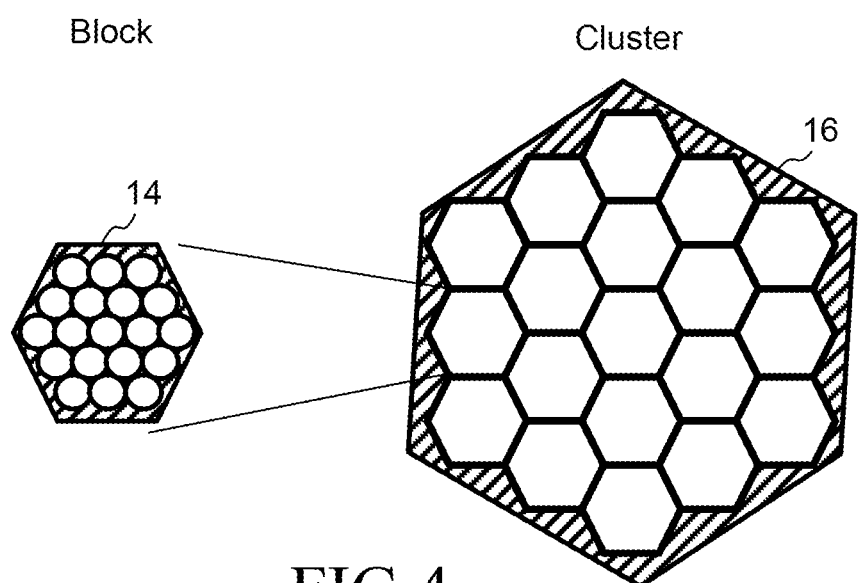
FIG. 4 is a diagram showing another example of the system configuration of the multiple-beam cluster according to the first embodiment.

FIG. 4 is a diagram showing another example of the system configuration of the multiple-beam cluster according to the first embodiment. In the examples of FIGS. 3 and 4, one multiple-beam set 12 is constructed of, for example, 19 electron beam columns 10a, 10b, 10c, . . . arranged in a honeycomb shape. In each of the electron beam columns 10, for example, a cylindrical column (electron optical barrel) is arranged in a frame having a regular hexagonal cross section. Then, in the multiple-beam set 12, these 19 electron beam columns 10a, 10b, 10c, . . . are suitably configured to be put together and fitted into a frame having a regular hexagonal cross section to be unitized. Then, one multiple-beam block 14 is constructed of, for example, 19 multiple-beam sets 12a, 12b, 12c, . . . arranged in a honeycomb shape. Then, in the multiple-beam block 14, these 19 multiple-beam sets 12a, 12b, 12c, . . . are suitably configured to be put together and fitted into a frame having a regular hexagonal cross section to be unitized. Then, one multiple-beam cluster 16 is constructed of, for example, 19 multiple-beam blocks 14a, 14b, 14c, . . . arranged in a honeycomb shape. Then, in the multiple-beam cluster 16, these 19 multiple-beam blocks 14a, 14b, 14c, . . . are suitably configured to be put together and fitted into a frame having a regular hexagonal cross section to be unitized. By arranging in the honeycomb structure, unnecessary gaps can be reduced and the number of arrays of the electron beam columns 10 per unit area can be increased (the electron beam column 10 can be densely arranged). In other words, the number of multiple beam beams per unit area can be increased (multiple beams can be densely arranged). In the examples of FIGS. 3 and 4, it is possible to irradiate 6859 multiple beams by one multiple-beam cluster 16.

Figure 5:
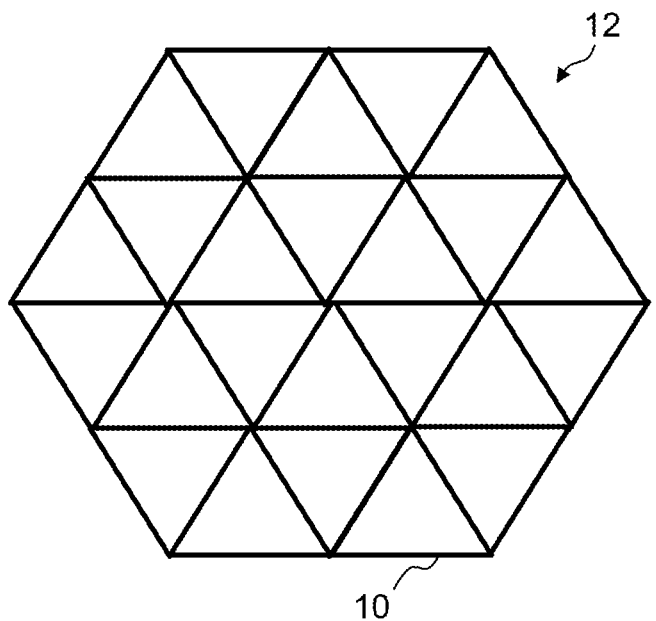
FIG. 5 is a diagram showing another example of the system configuration of a multiple-beam set according to the first embodiment.

FIG. 5 is a diagram showing another example of the system configuration of a multiple-beam set according to the first embodiment. In the example of FIG. 5, one multiple-beam set 12 is constructed by, for example, 24 electron beam columns 10a, 10b, 10c, . . . arranged to form regular hexagons by combining sides of a plurality of regular triangles. In each of the electron beam columns 10, for example, a cylindrical column (electron optical barrel) is arranged in a frame having a regular triangular cross section. Then, in the multiple-beam set 12, these 24 electron beam columns 10a, 10b, 10c, . . . are suitably configured to be put together and fitted into a frame having a regular hexagonal cross section to be unitized. The system configurations of the multiple-beam block 14 and the multiple-beam cluster 16 may be the same as in FIGS. 3 and 4. In the example of FIG. 5, it is possible to irradiate 8664 multiple beams by one multiple-beam cluster 16.

Figure 6:
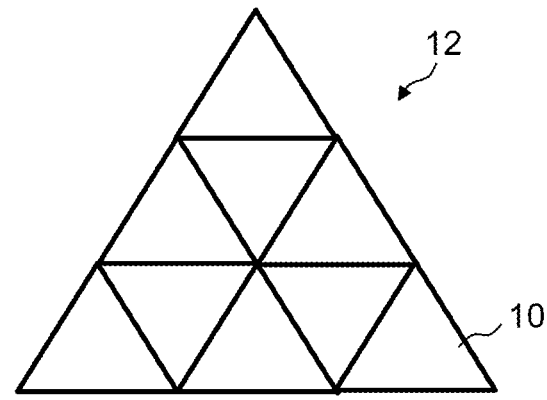
FIG. 6 is a diagram showing still another example of the system configuration of the multiple-beam set according to the first embodiment.

FIG. 6 is a diagram showing still another example of the system configuration of the multiple-beam set according to the first embodiment. In the example of FIG. 6, one multiple-beam set 12 is constructed by, for example, nine electron beam columns 10a, 10b, 10c, . . . arranged to form regular triangles by combining sides of a plurality of regular triangles. In each of the electron beam columns 10, for example, a cylindrical column (electron optical barrel) is arranged in a frame having a regular triangular cross section. Then, in the multiple-beam set 12, these nine electron beam columns 10a, 10b, 10c, . . . are suitably configured to be put together and fitted into a frame having a regular triangular cross section to be unitized. For the system configurations of the multiple-beam block 14 and the multiple-beam cluster 16, as shown in FIG. 6, a plurality of triangles may be arranged so as to form a regular triangle by combining sides of the regular triangles. In the example of FIG. 6, it is possible to irradiate, for example, 729 multiple beams by one multiple-beam cluster 16.

Figure 7:
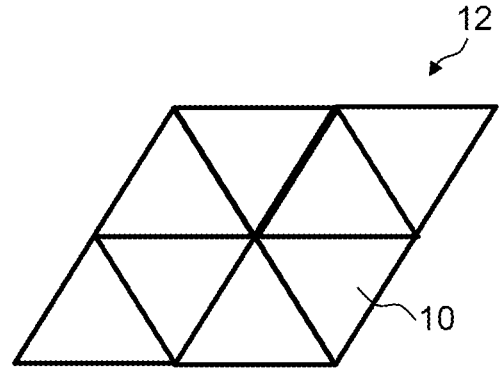
FIG. 7 is a diagram showing still another example of the system configuration of the multiple-beam set according to the first embodiment.

FIG. 7 is a diagram showing still another example of the system configuration of the multiple-beam set according to the first embodiment. In the example of FIG. 7, one multiple-beam set 12 is constructed by, for example, eight electron beam columns 10a, 10b, 10c, . . . arranged to form parallelograms by combining sides of a plurality of regular triangles. In each of the electron beam columns 10, for example, a cylindrical column (electron optical barrel) is arranged in a frame having a regular triangular cross section. Then, in the multiple-beam set 12, these eight electron beam columns 10a, 10b, 10c, . . . are suitably configured to be put together and fitted into a frame having a parallelogram cross section to be unitized. For the system configurations of the multiple-beam block 14 and the multiple-beam cluster 16, a plurality of parallelograms may be arranged so as to form a parallelogram by combining sides of the parallelograms.

In any of the arrangement configurations of FIG. 2A to FIG. 2C to FIG. 7, one unitized multiple-beam set 12 is constructed of a plurality of electron beam columns 10a, 10b, 10c, . . . . Similarly, one unitized multiple-beam block 14 is constructed of a plurality of multiple-beam sets 12a, 12b, 12c, . . . . Similarly, one unitized multiple-beam cluster 16 is constructed of a plurality of multiple-beam blocks 14a, 14b, . . . . By dividing the configuration into a plurality of unitized layers, units can be easily combined according to the level of the number of beams to be added. In other words, the number of beams of the multiple beam can be easily increased according to the level of the additional number.

Figure 8:
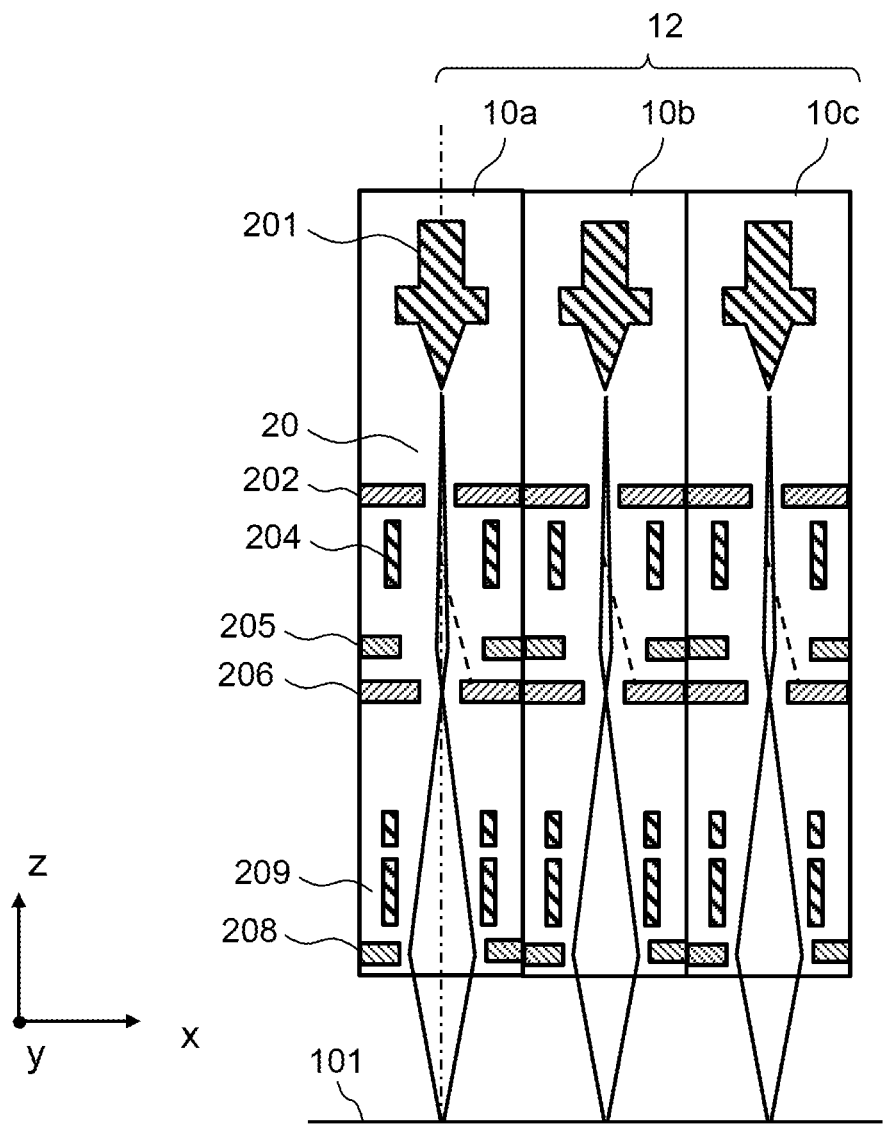
FIG. 8 is a diagram showing an example of an internal configuration of an electron beam column according to the first embodiment.

FIG. 8 is a diagram showing an example of an internal configuration of an electron beam column according to the first embodiment. In each of the electron beam columns 10a, 10b, 10c, . . . , an electron gun assembly 201, a limiting aperture plate substrate 202, a blanking deflector 204, an electrostatic lens 205, a limiting aperture plate substrate 206, an electrostatic lens 208, and an objective deflector 209 are arranged. The example of FIG. 8 shows a case where the electron beam columns 10a, 10b, 10c, . . . are individually configured by the electron gun assembly 201, the limiting aperture plate substrate 202, the blanking deflector 204, the electrostatic lens 205, the limiting aperture plate substrate 206, the electrostatic lens 208, and the objective deflector 209 being arranged in, for example, one cylindrical electron optical barrel (column). As shown in the example of FIG. 8, the electron gun assembly 201 serving as an independent irradiation source for irradiating an electron beam is individually arranged in each of the electron beam columns 10a, 10b, 10c, . . . . Further, in each of the electron beam columns 10a, 10b, 10c, . . . , the objective deflector 209 that deflects the corresponding electron beam to a desired position on the substrate 101 serving as a target object is individually arranged. Therefore, each of the multiple-beam sets 12 includes a plurality of electron gun assemblies 201 that irradiate independent electron beams and a plurality of objective deflectors 209 that deflect the corresponding electron beams to desired positions on the substrate 101. Further, in the example of FIG. 8, a plurality of electrostatic lenses 205, 208 that guide the corresponding electron beams so as to focus on the substrate 101 are individually arranged in each of the electron beam columns 10a, 10b, 10c, . . . it is assumed that the diameter of a region occupied by one electron beam column 10 is, for example, about 2 mm, and the distance from the tip of the electron gun assembly to the surface of the substrate 101 is, for example, about 20 mm. The acceleration voltage is, for example, 3 kV. Lenses with such a small structure can be manufactured by using MEMS technology or micro machining technology.

If it is assumed here that the stage moving direction is the x direction, when the minimum value of a deflection region in the y direction of a certain electron beam column 10 is y1, the maximum value thereof is y2, and the range in the y direction defined by y1≤y≤y2 is defined as wy, the y directional range covered by an entire range Wytot obtained by combining all wy is such that at least the range in the y direction where a pattern is to be written is covered and there is no gap. This makes it possible to expose the entire region where a pattern is to be written even by moving the stage only in the x direction.

In each of the electron beam columns 10a, 10b, 10c, . . . , an electron beam 20 emitted from the electron gun assembly 201 (emission source) illuminates the limiting aperture plate substrate 202 as a whole. A rectangular or circular hole (opening) is formed in the center of the limiting aperture plate substrate 202, and a portion of the electron beam 20 passes through such a hole, whereby a beam shape is formed. In this manner, a common voltage is applied to the plurality of electron gun assemblies 201 in the multiple-beam set 12 via the relay circuit 180 under the control of the power supply circuit 170. In the example of FIG. 8, for example, a micro field electron source (field emission type electron gun assembly) is used as the electron gun assembly 201. In the micro field electron source, an electron group emitted from an emitter (not shown) is accelerated by application of, in addition to the application of an acceleration voltage from the power supply circuit 170 to between the emitter and an extraction electrode (anode), a voltage of an extraction electrode (Wehnelt) before being emitted as the electron beam 20. Because a common voltage is applied to the plurality of electron gun assemblies 201 from the same power supply circuit 170 (or the same relay circuit 180), the numbers of power supply systems and control systems can be greatly reduced as compared with the number of beams. However, the present embodiment is not limited to such a case. By controlling the voltage applied to the extraction electrode (Wehnelt) of each of the electron gun assemblies 201, the current emitted from the emitter can be controlled. Further, the electron gun assemblies 201 may be ON/OFF controlled individually. Unlike the case where multiple beams are formed from a beam emitted from one electron gun assembly, the electron gun assembly 201 of each of the electron beams 20 is different and thus, an increase in output of each of the electron gun assemblies 201 is not dispersed to a plurality of beams so that the amount of current per beam can be greatly increased. Therefore, if the amount of current from each of the electron aun assemblies 201 is increased, the current amount of the entire multiple beams can be greatly increased. Therefore, the amount of current per unit area increases and the dose amount per unit time can be increased correspondingly. Therefore, the beam irradiation time for giving the dose amount necessary for resolving the resist on the substrate 101 can be greatly shortened, and the throughput can be improved.

The electron beam 20 having passed through the hole of the limiting aperture plate substrate 202 passes through the blanking deflector 204. The blanking deflector 204 individually deflects (deflects by blanking) a passing electron beam 20. The electron beam 20 that has not been deflected as beam ON by the blanking deflector 204 is reduced by the electrostatic lens 205 and advances toward the center hole formed in the limiting aperture plate substrate 206. Here, the electron beam 20 (dotted line) deflected so as to be in a beam OFF state by the blanking deflector 204 deviates from the center hole of the limiting aperture plate substrate 206 and is shielded by the limiting aperture plate substrate 206. On the other hand, the multiple electron beams 20 not deflected by the blanking deflector 204 pass, as shown in FIG. 8, through the center hole of the limiting aperture plate substrate 206. Blanking control is performed by ON/OFF of the individual blanking mechanism (individual ON/OFF mechanism) constructed of the blanking deflector 204 and the limiting aperture plate substrate 206 to control ON/OFF of the beam. Then, a beam for one shot is formed by a beam formed between beam ON and beam OFF and having passed through the limiting aperture plate substrate 206. In this way, a plurality of individual blanking mechanisms (individual ON/OFF mechanisms) in the multiple-beam set 12 is controlled by the deflection control circuit 130 to individually turn ON/OFF the beam irradiated from a corresponding electron gun assembly 201 as an irradiation source via the relay circuit 184. Therefore, in each layer of the multiple-beam cluster 16, the multiple-beam block 14, and the multiple-beam set 12, each beam is independently ON/OFF-controlled individually.

The electron beam 20 having passed through the limiting aperture plate substrate 206 is focused on the substrate 101 by the electrostatic lens 208 as an objective lens to become a pattern image of a desired reduction ratio. Then, the electron beam 20 having passed through the limiting aperture plate substrate 206 is deflected by the objective deflector 209 and a desired irradiation position on the substrate 101 is irradiated with the electron beam 20. In FIG. 8, in order to suppress an increase in deflection aberration, an example is shown in which two-stage deflection with two stages of deflectors is adopted.

Figure 9:
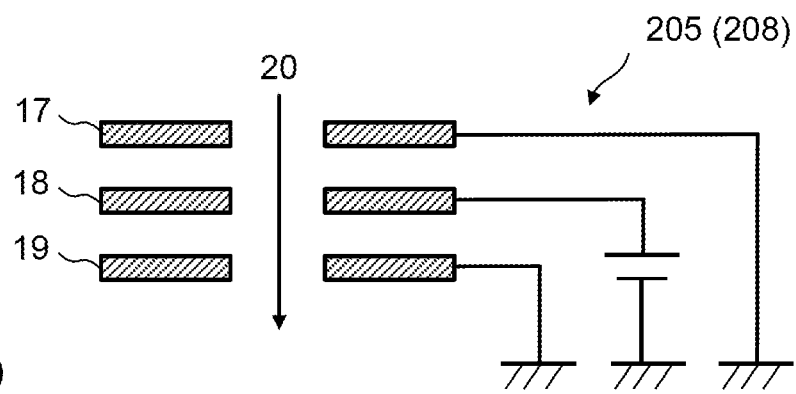
FIG. 9 is a sectional view showing an example of an electrostatic lens according to the first embodiment.

FIG. 9 is a sectional view showing an example of an electrostatic lens according to the first embodiment. One electrostatic lens 205 (or 208) is constructed of three-stage disc-like electrodes 17, 18, and 19 having a central opening. A ground potential is applied to the upper and lower electrodes 17 and 19, and the intensity of lens action for refracting electrons is adjusted by adjusting the potential of the electrode 18 in the center. In the example of FIG. 8, an electrostatic lens is used for reduction, projection, and objective lens, but the present embodiment is not limited thereto. An electromagnetic lens may be arranged. Alternatively, a combination of an electrostatic lens and an electromagnetic lens may also be arranged. In the example of FIG. 8, each of the electrostatic lenses 205 arranged in the same multiple-beam set 12 is suitably controlled commonly via the relay circuit 182 under the control of the lens control circuit 134. Similarly, each of the electrostatic lenses 208 arranged in the same multiple-beam set 12 is suitably controlled commonly via the relay circuit 182 under the control of the lens control circuit 134. With such a configuration, each electrostatic lens of the plurality of electron beam columns 10a, 10b, 10c, . . . in one multiple-beam set 12 can be controlled by distributing a common signal. Therefore, regardless of the number of the electron beam columns 10 constituting the multiple-beam set 12, the control system can be simplified.

Especially when there is a distribution in the target object surface height, if the size of the area covered by the multiple-beam set is smaller than the width of the area in which one focus condition of the distribution of the target object surface height variation correction is allowed, the correction amount for the focus adjustment of the multiple-beam set may be common. Also when the dynamic focus correction is performed to change the potential distribution of the electrostatic lens electrode so that the blur of the electron beam on the target object surface becomes smaller in response to the target object surface height, it is possible to reduce the control power supply for dynamic focus correction by using a common power supply in the multiple-beam set.

Figure 10:
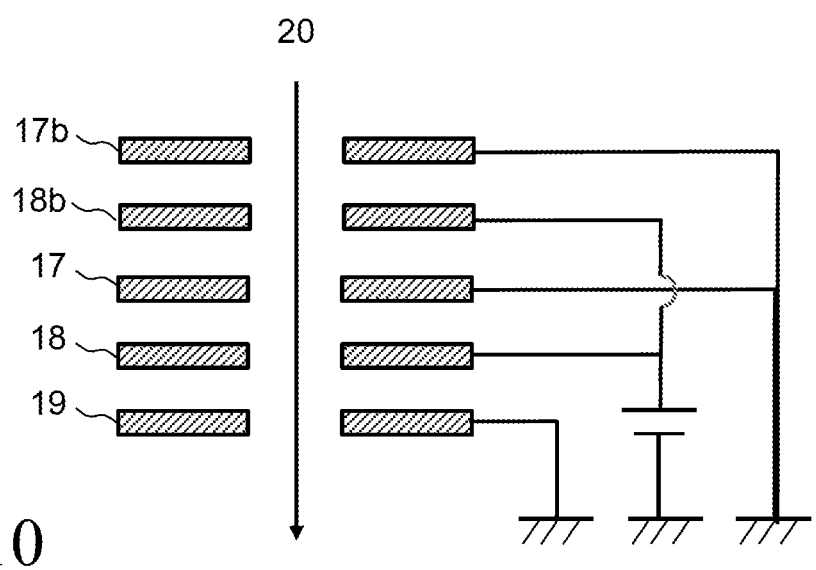
FIG. 10 is a sectional view showing another example of the electrostatic lens according to the first embodiment.

FIG. 10 is a sectional view showing another example of the electrostatic lens according to the first embodiment. As shown in FIG. 10, electrostatic lenses can be used in multiple stages. This is effective for reducing the applied voltage. The same voltage can be applied to electrodes 18, 18b, or different voltage outputs can be connected to apply different voltages. The number of stages can be further increased. The ground potential is applied to an electrode 17b.

Figure 11:
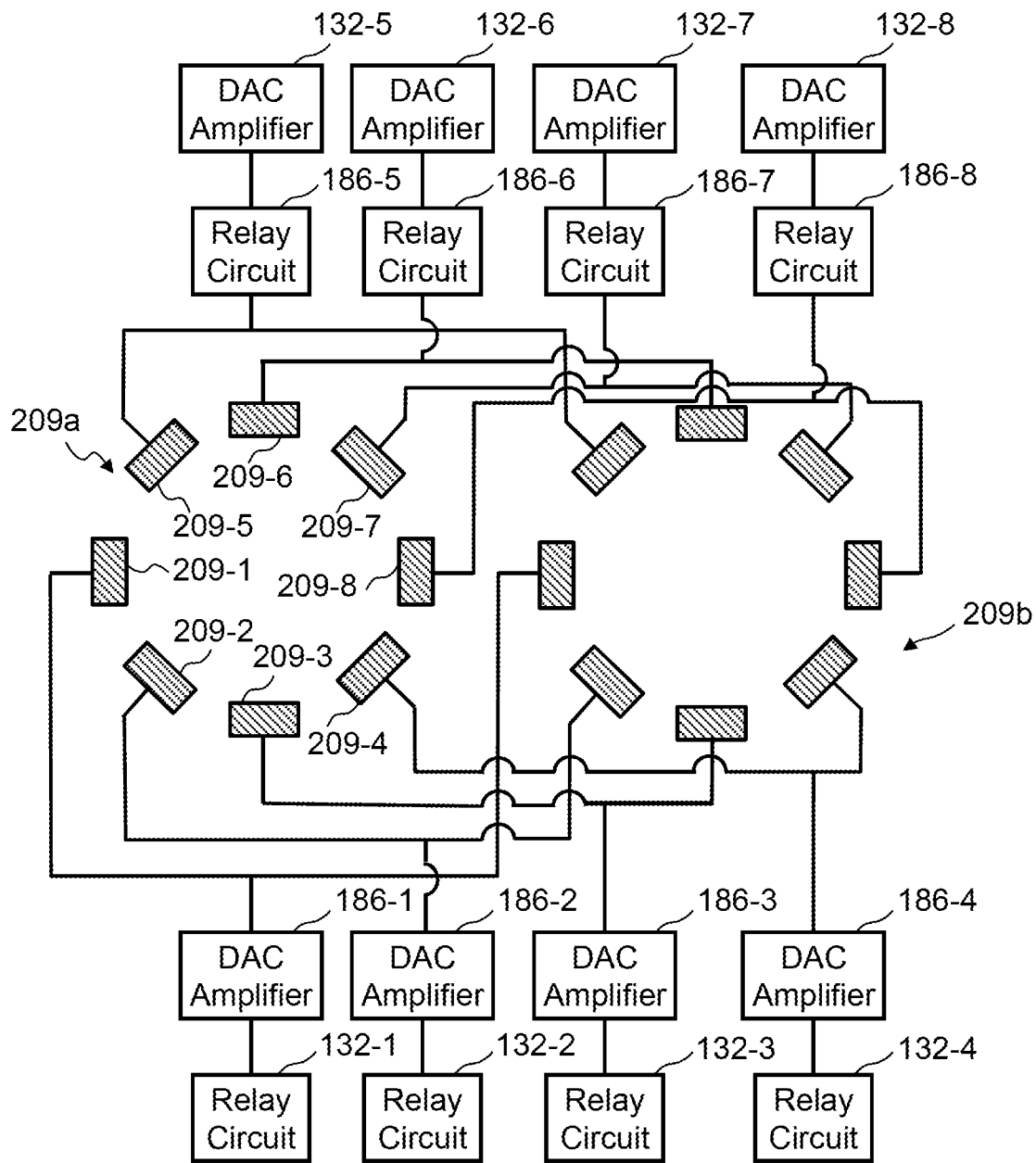
FIG. 11 is a top view showing an example of the relationship between objective deflectors and deflection amplifiers according to the first embodiment.

FIG. 11 is a top view showing an example of the relationship between objective deflectors and deflection amplifiers according to the first embodiment. The example of FIG. 11 shows a case where the objective deflector 209 is constructed of, for example, eight electrodes 209-1 to 209-8. By adjusting the potentials applied to the electrodes 209-1 to 209-8, it is possible to deflect the electron beam 20 passing through the central portion surrounded by the eight electrodes 209-1 to 209-8. In the example of FIG. 11, under the control of the deflection control circuit 130, each of the objective deflectors 209 arranged in the same multiple-beam set 12 is controlled in common via the relay circuit 186 using the output from the common DAC amplifier 132. More specifically, for example, the potential as output of the same DAC amplifier 132-1 distributed by the same relay circuit 186-1 is applied to electrodes 209-1 of the objective deflectors 209a, 209b, arranged in the same multiple-beam set 12. Similarly, the potential as output of the same DAC amplifier 132-2 distributed by the same relay circuit 186-2 is applied to electrodes 209-2 of the objective deflectors 209a, 209b, arranged in the same multiple-beam set 12. Similarly, the potential as output of the same DAC amplifier 132-3 distributed by the same relay circuit 186-3 is applied to electrodes 209-3 of the objective deflectors 209a, 209b, arranged in the same multiple-beam set 12. Similarly, the potential as output of the same DAC amplifier 132-4 distributed by the same relay circuit 186-4 is applied to electrodes 209-4 of the objective deflectors 209a, 209b, arranged in the same multiple-beam set 12. Similarly, the potential as output of the same DAC amplifier 132-5 distributed by the same relay circuit 186-5 is applied to electrodes 209-5 of the objective deflectors 209a, 209b, arranged in the same multiple-beam set 12. Similarly, the potential as output of the same DAC amplifier 132-6 distributed by the same relay circuit 186-6 is applied to electrodes 209-6 of the objective deflectors 209a, 209b, arranged in the same multiple-beam set 12. Similarly, the potential as output of the same DAC amplifier 132-7 distributed by the same relay circuit 186-7 is applied to electrodes 209-7 of the objective deflectors 209a, 209b, arranged in the same multiple-beam set 12. Similarly, the potential as output of the same DAC amplifier 132-8 distributed by the same relay circuit 186-8 is applied to electrodes 209-8 of the objective deflectors 209a, 209b, arranged in the same multiple-beam set 12. In this manner, a plurality of common DAC amplifiers 132, which are common deflection amplifiers arranged for each of the multiple-beam sets 12, controls a plurality of objective deflectors 209 arranged in the same multiple-beam set 12 in common. Therefore, regardless of the number of the electron beam columns 10 constituting the multiple-beam set 12, control can be exercised by the same number of deflection amplifiers as the number of electrodes of the objective deflectors 209 constituting one electron beam column 10 in the multiple-beam set 12. Therefore, when one objective deflector 209 is constructed of, for example, eight electrodes, eight DAC amplifiers 132 are required for each beam, but when, for example, 1800 beams are irradiated at a time as multiple beams, a situation where 14400 DAC amplifiers 132 are required and the control of the 14400 DAC amplifiers 132 is needed as in the past can be avoided. When the multiple-beam set 12 is constructed of nine electron beam columns 10 and, for example, 1800 beams irradiated at a time as multiple beams, 1600 DAC amplifiers 132 are adequate and the control of the 1600 DAC amplifiers 132 is adequate. If the number of the electron beam columns 10 constituting the multiple-beam set 12 increases, the number of the DAC amplifiers 132 and the number of the DAC amplifier 132 to be controlled can be further reduced.

In addition, it is possible to arrange a deflector for alignment and astigmatism correction for individual beams so that the trajectory can be finely adjusted. Such an individual alignment deflector is basically static and do not deflect during pattern writing operation so that the circuit can be greatly simplified.

Similarly, it is possible to provide an electrostatic lens for fine adjustment of the focal point. This is also basically static and the voltage is low so the circuit can be simplified.

Figure 12:
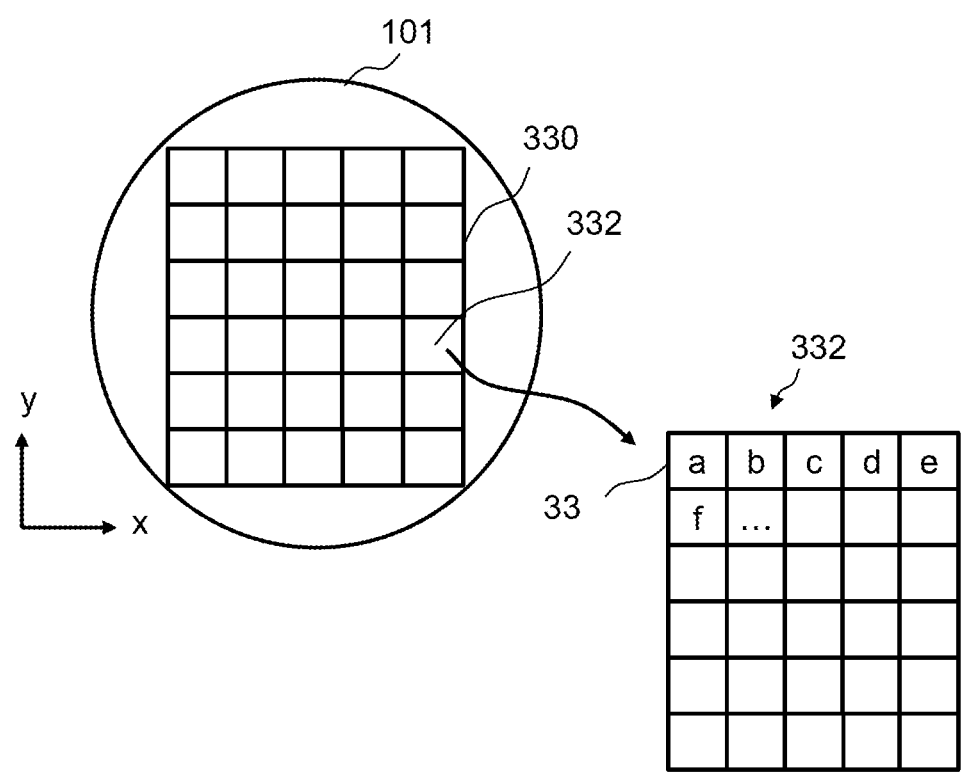
FIG. 12 is a diagram showing an example of a plurality of chip regions formed on a semiconductor substrate according to the first embodiment.

FIG. 12 is a diagram showing an example of a plurality of chip regions formed on a semiconductor substrate according to the first embodiment. In FIG. 12, when the substrate 101 is a semiconductor substrate (wafer), a plurality of chip (wafer die) regions 332 is provided in a two-dimensional array in a pattern writing region 330 of the semiconductor substrate (wafer). In each of the chip regions 332, the same pattern for one chip is directly written by the lithography apparatus 100 without going through a mask pattern. In the example of FIG. 12, each of the chip regions 332 is divided into, for example, a plurality of small regions 33 in a two-dimensional shape of $m_2$ columns in the width direction (x direction)×$n_2$ tiers in the length direction (y direction) ($m_2$ and $n_2$ are integers of 2 or greater). Each of the small regions 33 is further decomposed into pixels. The position of each pixel and the dose (beam irradiation time) are defined as beam irradiation time data. The plurality of multiple-beam sets 12 respectively writes different one or more of exposure pixel groups on the same substrate 101.

Here, in the multiple-beam set for writing the vicinity of the boundary of the substrate 101, there is a case in which different electron beams included in the same multiple-beam set may be respectively irradiated to different substrates. Further, in the electron beam column without the pixel of the exposure target, the electron beam is blanked (in a beam-off state) while there is no exposure target.

In addition, an exposure pixel group to be exposed by a different multiple-beam set 12 is arranged between exposure pixel groups exposed by one multiple-beam set 12. Then, pattern writing processing of the substrate 101 is completed by the substrate 101 passes through irradiable regions of the plurality of multiple-beam sets 12. A specific operation is as described below.

Pattern writing is performed while continuously moving the stage 105. In the meantime, while one corresponding pixel is irradiated with each electron beam, the deflector 209 is used to deflect the electron beam according to the movement of the stage 105 so that the irradiation position of each electron beam is on the same pixel without deviating from the irradiated pixel on the surface of the substrate 101. This is called stage tracking. Here, the stage position information is determined by using the stage position measuring mechanism 138. The stage tracking is performed within a range not exceeding a given maximum deflection amount, and after the stage 105 moves a certain distance, the deflection position is returned to the next irradiation position near the initial deflection position. The above is repeated to write a pattern. The stage tracking may be configured so as to return to the vicinity of the initial deflection position every time one pixel is irradiated with an electron beam or to return to the next irradiation position near the initial deflection position after irradiating a plurality of pixels with an electron beam. The dose of an electron beam to each pixel is adjusted by independently adjusting the beam irradiation time of the beam to the substrate 101 surface by using a blanking means of each beam. Also, while moving between pixels, a blanking operation is performed so that all beams do not reach the target object surface. Because the stage moves continuously, control is exercised so that different pixels in the same small region are irradiated with electron beams of different multiple-beam blocks 14 and when the substrate 101 passes downstream of all multi-clusters 16, all pixels on the substrate 101 are irradiated with an electron beam of a predetermined dose. In other words, there is a portion exposed to beams of the same multiple-beam block 14 among the pixel array within a small region, and there is a portion exposed to beams of different multiple-beam blocks 14. In the following, for the sake of simplicity, the time needed to turn off a beam to return the deflection to its original is ignored. Also, the effect of the width of a frame used to fix the multiple-beam set 12 and the multiple-beam block 14 is ignored.

A case where all pixels with 10 nm pitches are exposed to an electron beam by assuming that, for example, one pixel corresponds to 10 nm square is considered. When the electron beam columns 10 capable of irradiating one pixel region with one electron beam are arranged in a square lattice as shown in FIG. 2A to FIG. 2C and the interval between the electron beam columns 10 is 2 mm, $4 \times 10^{10}$ pixels are included in a region of 2 mm square surrounded by four adjacent electron beam columns 10. In reality, the current distribution of an electron beam is not localized within 10 nm square and follows, for example, a Gaussian distribution, and about 80% of the current is present within 10 nm square. However, in order to simplify the description, the current is approximated as being localized within 10 nm square. The small region size is assumed to be 2 mm. A deflection region is assumed to be 10 μm square. Now, it is assumed that the stage speed to 10 mm/s, the effective current density (current density when the total current uniformly flows through 10 nm square) is 500 A/cm$^2$, and the resist sensitivity is 50 uC/cm$^2$. When written as single pattern writing, the beam irradiation time for one pixel is 100 ns. In the meantime, the stage 105 moves by 1 nm.

Figure 13:
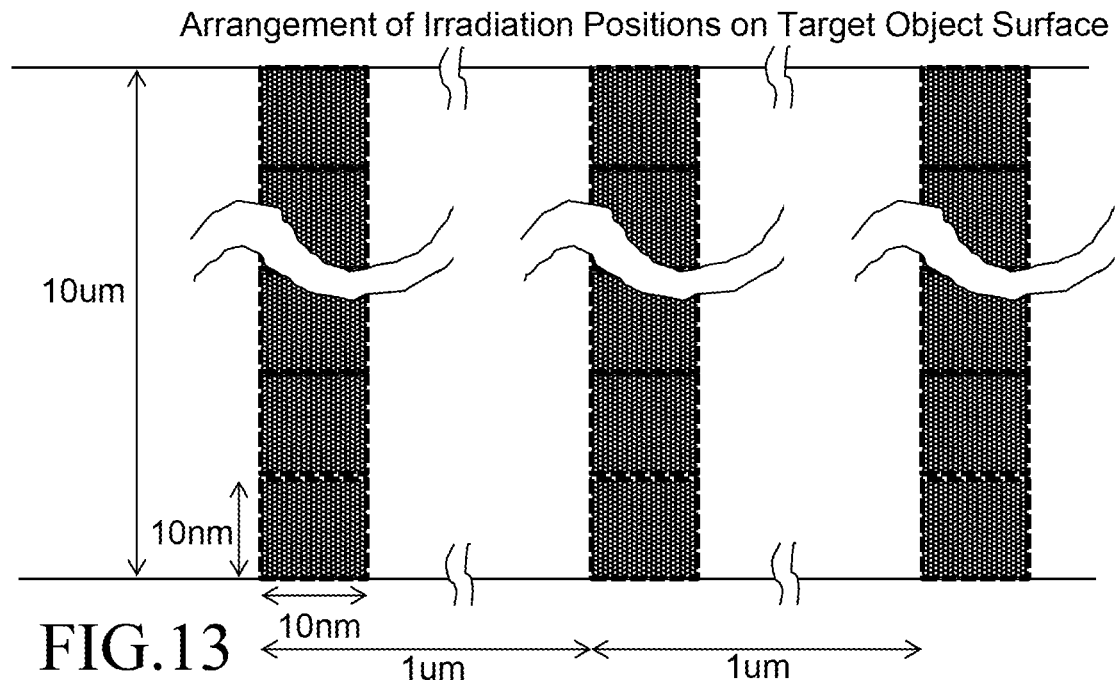
FIG. 13 is a diagram illustrating an example of a pattern writing procedure according to the first embodiment.

FIG. 13 is a diagram illustrating an example of a pattern writing procedure according to the first embodiment.

Figure 14:
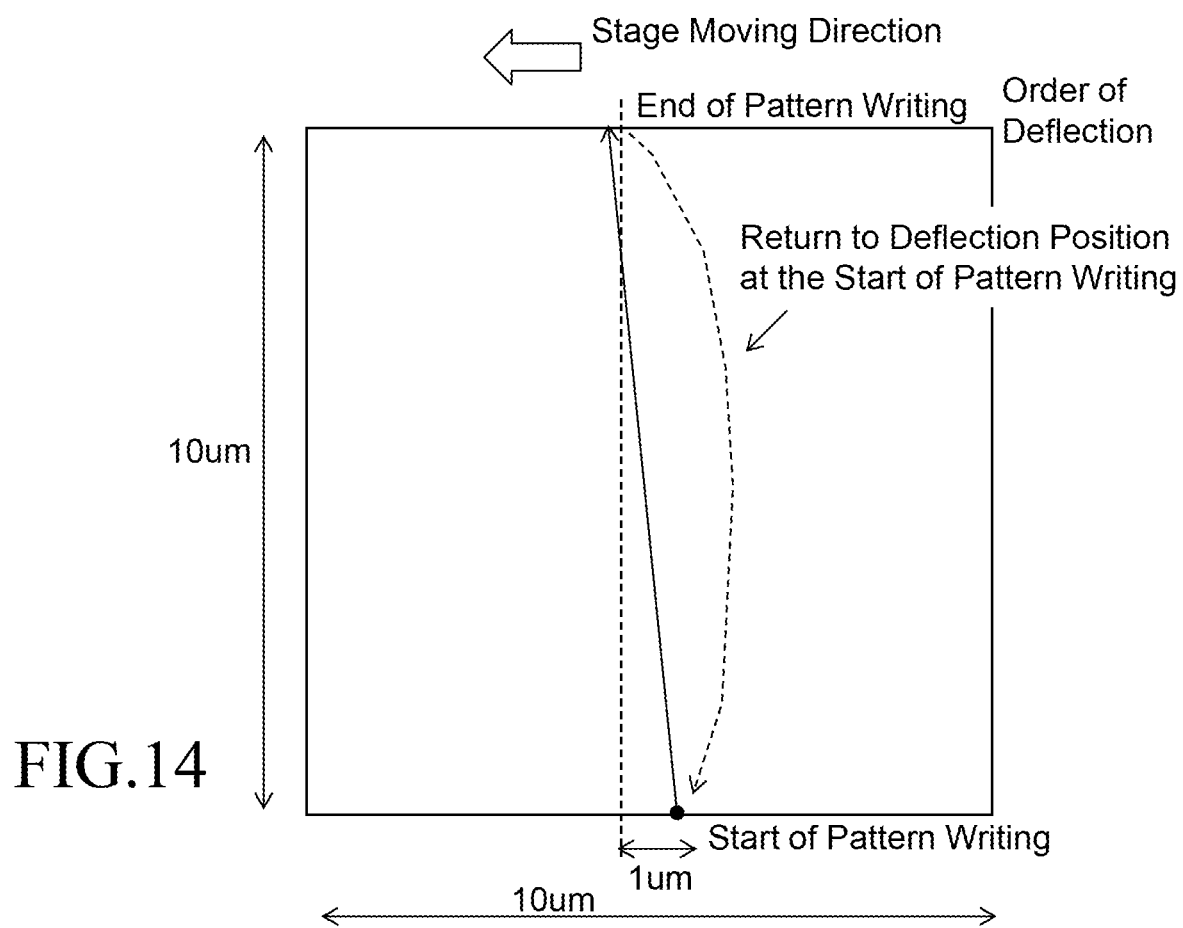
FIG. 14 is a diagram illustrating an example of the pattern writing procedure according to the first embodiment.

FIG. 14 is a diagram illustrating an example of the pattern writing procedure according to the first embodiment. As shown in FIGS. 13 and 14, while continuously moving the stage in the –x direction, the x-direction coordinate on the target object surface of an electron beam is fixed by deflection and then exposure is performed and after one pixel exposure, the electron beam is moved to the adjacent pixel in the y direction on the target object surface and exposure is performed, and this is continuously performed with the width of 10 μm. While 1,000 pixels aligned in the y direction to a width of 10 μm is exposed, the stage 105 moves by 1000×1 nm=1 μm in the –x direction. In the meantime, the electron beam is also deflected by 1 μm in the –x direction. Next, the electron beam is deflected by 1 μm in the x direction to return to the original x direction and y direction deflection position in the column to repeat the exposure. At this point, if the deflection position is not returned in the y direction, the deflection in the y direction during the next exposure can be made in the opposite direction to the previous exposure sequence.

The number of pixels included in the region of 10 μm×2 mm is $2 \times 10^8$, and the time for the stage to move 2 mm is 0.2 sec. During this period, the number of pixels that can be irradiated is 2,000,000. Therefore, one deflection width region of the same small region is made to be irradiated with $2 \times 10^8 / 2 \times 10^6 = 100$ different electron beams. Further, 2 mm/10 um=200 rows exist in a direction perpendicular to the stage advancing direction. Therefore, in the simplest model, it is necessary to irradiate $4 \times 10^{10}$ pixels in the 2 mm×2 mm region with 100×200=20,000 different electron beams. Considering that 300 mm width is filled in this way, 20,000×300/2=3,000,000 electron beams are needed. At this point, it is necessary to arrange 150 rows of electron beams in the lateral direction and 200×100=20,000 rows of electron beams in the longitudinal direction.

At this point, it is not necessary to arrange 20,000 electron beam columns 10 in one 2-mm wide stripe. What is necessary is that all exposure pixels on the surface of the substrate 101 can be exposed, and an offset may be added to the position in a direction perpendicular to the stage advancing direction as appropriate under the condition satisfying the above situation. In this case, it is necessary to increase the beam at the extreme end by one row, but the influence on the entire system is small. Conversely, considering a positional error of the installation of the substrate 101, the system desirably has as many electron beams as possible that can be made equal to or wider than the installation error of the substrate 101 as an exposable width of the electron beam.

In the simplest configuration that satisfies the condition, an electron beam array of 3,000,000 electron beams with a width of about 300 mm and a length of about 40 m is needed.

In another more realistic configuration, instead of arranging 20,000 rows of electron beams in the stage advancing direction, a beam array of a smaller size, for example, 2,000 rows is arranged in the advancing direction and the same effect as passing the 20,000 rows is effectively obtained by causing the same substrate 101 to pass below the same multiple-beam cluster 16 repeatedly 10 times or more. The length of a beam array of 2000 rows in the stage advancing direction is about 4 m, which is much larger than the size of the substrate 101. Correspondingly, the number of the substrates 101 (for example, 300 mm wafers) having a diameter of, for example, 30 cm to be mounted on the lithography apparatus at a time is set to 14 or more (4 m/30 cm≈) from 13.

In order to implement such an operation, a plurality of wafers is arranged in a row on the stage and then, two methods of (1) the stage is made to reciprocate and (2) the stage is made to circulate and the wafers are circumferentially arranged can be considered. In both cases, by moving the wafer by the necessary moving distance, all pixels are made to be irradiated with an electron beam. Further, in (2), as an example of the circulating motion of the stage, making the stage operate in a circular shape and operate in a racetrack shape can be considered. By mounting a plurality of wafers and correspondingly operating a plurality of clusters, the effective current amount of the entire system can be increased so that the exposure time per wafer can be shortened. In the example described above, if the exposure is completed in one pass, ideally, the pattern writing time per wafer is calculated as 300 mm/10 mm/s to 30 sec. However, considering the dead time, the stage moving speed is slightly lower than the above value, so the pattern writing time is longer than the above value. When multiple rotations are performed, the required exposure time becomes longer approximately in proportion to the number of rotations.

For each beam, the deflection of each electron beam uses the same control voltage in at least one multiple-beam set 12 and only the exposure time is independently controlled. Accordingly, the number of deflection amplifiers required for deflection control can be greatly reduced. Also, the input/output unit can be simplified.

In the above example, the pitch of the exposure pixels is set to 10 nm, but it is also possible to make the pitch smaller. For example, exposure can be performed by performing double pattern writing in which the exposure pixel is 5 nm square and the electron beam is shifted by 5 nm. Alternatively, the exposure pitch can be increased.

Figure 25:
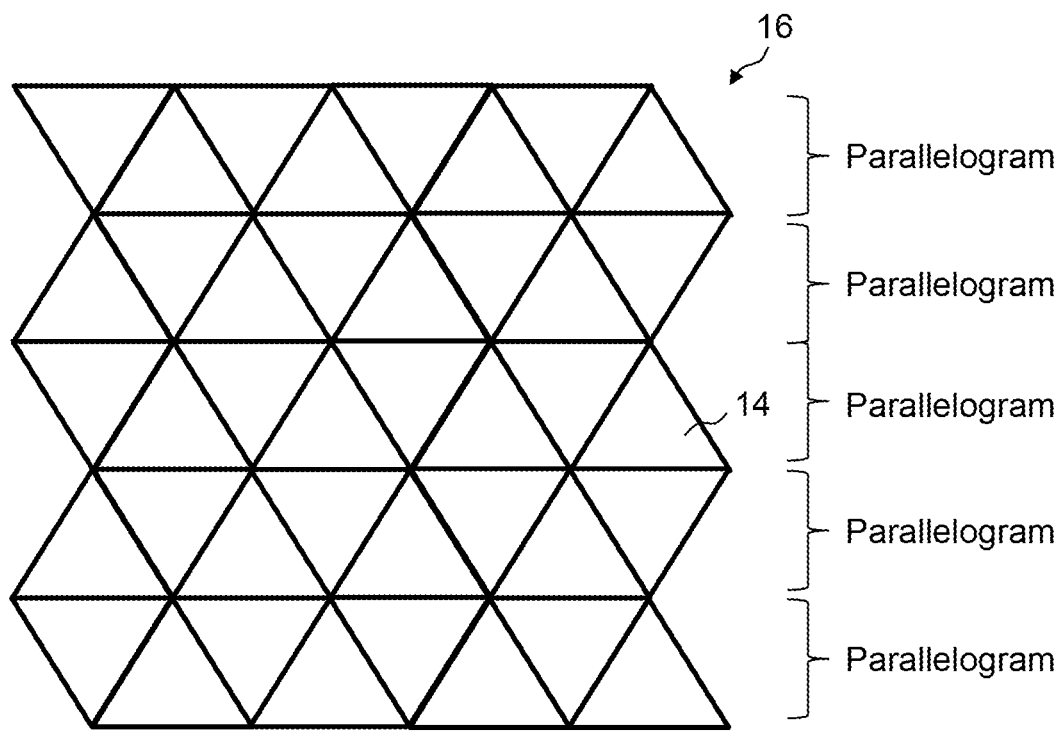
FIG. 25 is a diagram showing an example of the shape of a cluster of the first embodiment.

In the above discussion, the conditions for the wafer dimensions of 300 mm square are considered to be given. Actually, the wafer shape is generally round and so the number of beams required in the x direction decreases at a position away from the center of the wafer in the y direction. Therefore, the shape of the beam cluster is not rectangular, and the multiple-beam block 14 may be arranged so that the width in the x direction decreases in stages with an increasing distance from the wafer center in the y direction. In this way, the shape of the cluster can be changed according to the shape of the target object. Further, for example, as shown in FIG. 25, when a plurality of parallelograms having the same shape and including a plurality of multiple-beam blocks 14 (for example, eight multiple-beam blocks 14) are connected at the upper side of the drawing, it is also possible to arrange the parallelograms so that the sides of parallelogram pairs are in contact with each other and the directions of the sides of other parallelogram pairs are staggered. Also in this configuration, the width in the x direction can be made substantially uniform.

In the pattern writing method described above, by continuously moving the stage during pattern writing and irradiating a small region with electron beams belonging to different multiple-beam sets 12, multiple-beam blocks 14, and multiple-beam clusters 16, even when the beam pitch is much larger than the pixel size, pattern writing can be performed at high speed. Further, a plurality of multiple-beam clusters 16 can be arranged beyond one target object area and so, a beam current of the entire system can be increased and the pattern writing time per wafer can be drastically shortened.

In order to make the stage movement in the y direction unnecessary, when the electron beam pitch is 2 mm and the deflection width is 10 μm, the movement can be made unnecessary if there are 2 mm/10 μm=100 rows of stage advancing direction beams. Therefore, using one set of the multiple-beam clusters 16 of 150 rows×100 rows as the minimum unit, a wafer can be exposed while reciprocating the stage. In this case, if the number of wafers is one, the ratio of the presence of unexposed regions of the wafer is high during pattern writing and so the pattern writing efficiency is low and therefore, it is desirable to always operate an electron beam by mounting two wafers on the stage.

In the above discussion, an ideal apparatus has been described, but in practice, an error occurs in the pattern writing position due to various factors and beam exposure regions do not densely align so that gaps are formed or overlapping arises. Further, there is a case in which a defective electron beam column which cannot obtain electron beam emission from the electron gun assembly is included. When there is a reproducible error in the electron beam irradiation position, the occurrence of defects can be prevented by, for example, increasing the multiplicity of beam exposure so that the beam can be exposed to all pixels and then reallocating the exposure amount. For example, if eight-fold pattern writing is adopted and an extra time of about 15% is allocated to each exposure time, maximal one non-exposure can be made up by the seven remaining exposures. The multiple pattern writing method is also effective to suppress the influence of errors that are not reproducible. Further, when the number of electron beam columns is redundant so that a part of the electron beam columns is generally blanked (in a beam-off state), the pixel position to be irradiated by the defective electron beam column can be exposed only at the exposure enabled timing.

An example of a data processing method when pattern drawing on a wafer is performed by a lithography apparatus including a plurality of multiple-beam clusters 16 will be described below.

First, when pattern writing is performed using a pattern writing system including the plurality of multiple-beam clusters 16, for each beam, the pixel to be exposed and the contribution to the pixel are determined.

Generally, the deflection position is adjusted so as to coincide with the pixel to be exposed, but it is difficult to make the pixel to be exposed coincide with the beam irradiation position for all beams belonging to one multiple-beam set 12 due to individual differences of the deflector. When the beam center and the pixel center coincide with each other, 1 is set and when it deviates, a real number is set according to the dose to the pixel. The real number is usually equal to or less than 1. Generally, if apparatus conditions do not change, the allocation is common to all pattern writing. This allocation work may be done once.

Next, the exposure amount distribution on each wafer is determined based on design data of LSI to be written on the wafer. When the same LSI pattern is arranged side by side on the wafer and written, the simplest method is to find the exposure amount distribution for one LSI and arrange the distribution according to the arrangement of the LSI pattern. Generally, the optimum exposure amount for suppressing the influence of process error changes depending on the location on the wafer even for the same LSI pattern. When this correction is needed, the exposure distribution including the correction is determined.

Next, the dose for each irradiation position of each beam is determined from the relationship between the exposure amount distribution given to each pixel and the previously determined contribution of each beam. This calculation generally takes calculation time and so, the calculation time is saved by appropriate approximations. When the deviation between the beam irradiation position and the exposure pixel is small, pattern writing can be performed by making approximations that the beam irradiation position and the exposure pixel center coincide and further, making the dose coincide with the dose allocated to the exposure pixel. When the whole blur is a combination of a beam blur and a process blur, the entire blur due to one electron beam is larger than the exposure pixel in many cases and so, even in this case as well, the deviation of the obtained dose distribution from the desired dose distribution is small.

Pattern writing is performed based on the beam irradiation time at each irradiation position of each obtained beam.

When the gradation of the dose may be small, for example, eight gradations may be used for eight-fold pattern writing and there is no need to consider the influence of a beam irradiation position error, switching whether or not to irradiate each beam is performed so that the beam irradiation time of all beams to be irradiated can be made to be the same. In this case, the dose control system can be greatly simplified.

For example, it is conceivable to arrange 15 multiple-beam clusters 16 of 150 rows×150 rows as a method of implementing a beam array of 2000 rows or more in the advancing direction. Further, by constructing each of the multiple-beam clusters 16 as, for example, the multiple-beam blocks 14 of 50 rows×50 rows and further, each of the multiple-beam blocks 14 as the multiple-beam sets 12 of 10 rows×10 rows, it is extremely effective from the viewpoint of the structure of the apparatus and maintenance to adopt a configuration in which each beam set, each of the multiple-beam blocks 14, and each of the multiple-beam clusters 16 is removable from the main body system. It is desirable to provide a contact point of a deflection signal in the connecting portion of the multiple-beam set 12 to the multiple-beam block 14 by setting the deflection operation as a block unit operation. Also, it is possible to fine-tune the control of the electrostatic lens by adopting the multiple-beam set 12 as the unit of control.

By adopting a structure having a hierarchy like this, it becomes easy to expand the system, and the size and the number of the multiple-beam clusters 16 are changed according to the desired target object size and exposure time.

Figure 15:
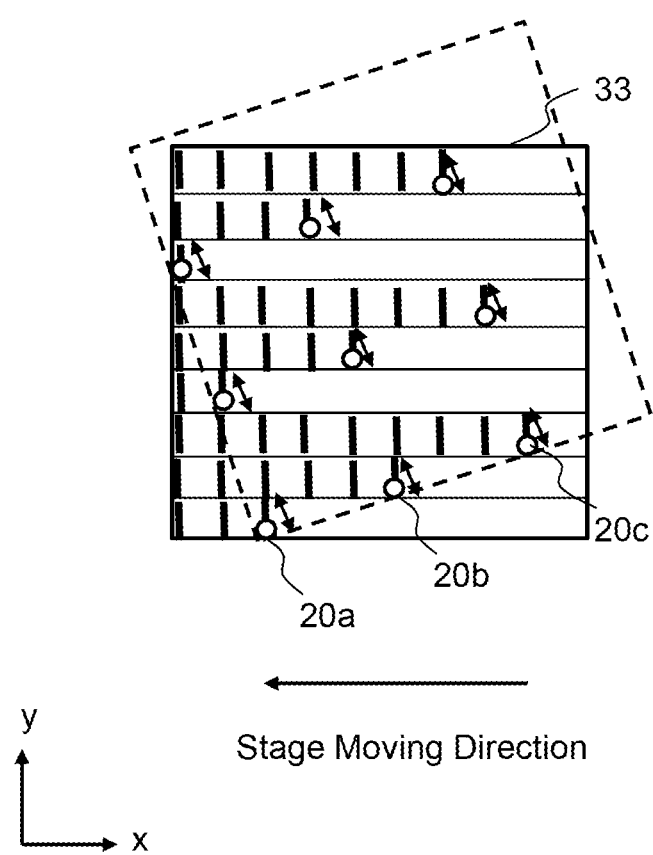
FIG. 15 is a diagram showing an example of a pattern writing technique when a pattern is written in a small region in the chip region in the first embodiment with the multiple-beam set.

FIG. 15 is a diagram showing an example of a pattern writing technique when a pattern is written in a small region in the chip region in the first embodiment with the multiple-beam set. The example of FIG. 15 shows a case where the multiple-beam set 12 is constructed of, for example, 3×3 electron beam columns 10. Thus, the multiple-beam set 12 can irradiate, for example, 3×3 multiple beams. In the example of FIG. 15, the size in the y direction of a small region 33 in the chip region 332 is divided by the number of beams (9) of the multiple-beam set 12 into a plurality of stripe regions in a strip form. Then, the multiple-beam image is rotated at an angle at which each of the electron beams 20 of 3×3 multiple beams can take charge of one stripe region at a time. This can be implemented by arranging the phase of the multiple-beam set 12 at an angle with respect to the stage advancing direction. Alternatively, beam groups each being three beams arranged in the y direction may be arranged in parallel at equal pitches in the x direction, and each beam group arranged in the x direction may be arranged to shift in order by the width of the stripe in the y direction. FIG. 15 shows an example in which the width of each stripe is within the deflection width and the stage 105 is continuously moved, for example, in the −x direction. Accordingly, the electron beams 20a, 20b, 20c, . . . write a pattern while raster-scanning the stripe region in charge according to the movement of the stage 105. More specifically, it is sufficient to turn on the beam at the position where a pattern is present and to turn off the beam at the position where no pattern is present.

In FIG. 15, the position exposed to each beam is indicated by a solid line. Each electron beam is deflected in the −x direction according to the moving speed of the stage and moves in the y direction after completion of exposure of one pixel. After exposure of an edge pixel, each beam is deflected in the x direction to return to the original deflection position and resumes pattern writing. In this example, a case where the stage moves in the −x direction by the same distance as the stripe width when the exposure in the y direction is completed. On the target object surface, y-direction straight lines as the exposure stripes are aligned in the x direction at regular intervals. It should be noted that this is an example, and it is not absolutely necessary for the exposure regions to be arranged consecutively in the y direction. A region not covered with a line remains in the stripe region, indicating that the chip region 332 as a whole cannot be exposed while the stage passes once. The exposure positions of beams of different multiple-beam sets 12 are made different from the exposure positions of other multiple-beam sets 12, and the unexposed regions are exposed by subsequent multiple-beam sets 12. Hereinafter, when the multiple-beam set 12 passes through a certain small region once, a set of pixels exposed by a certain beam belonging to the multiple-beam set 12 is called an exposure pixel group belonging to the small region and corresponding to the beam. By exposing all exposure pixel groups within the small region, all pixels within the small region are exposed. There may be an overlap of exposure pixel groups corresponding to different beams.

Also, in order to check the soundness of the system, it is desirable to provide a beam measuring means outside a target object position on the stage. It is desirable to be able to measure the beam current, position, and beam blur of individual beams by the beam measuring means. The soundness of each electron beam can be checked by passing a measuring means installation region under the whole electron beams during exposure or before or after exposure. When a beam in which an abnormality occurs is found, for example, a spare column that is not normally used is provided and the emission of the electron beam from the column where the abnormality has occurred is stopped and supplemented by the spare column instead. If the number of abnormal columns increases beyond a certain number, the system is stopped to replace the multiple-beam set 12 including abnormal beams. The multiple-beam set 12 that has been removed is kept as a spare multiple-beam set 12 after the abnormal column is repaired or replaced.

As a specific configuration of the beam measuring means, it is sufficient to include a Faraday cup for current measurement, an opening type mark for position measurement, and a Faraday cup with a knife edge.

Figure 16:
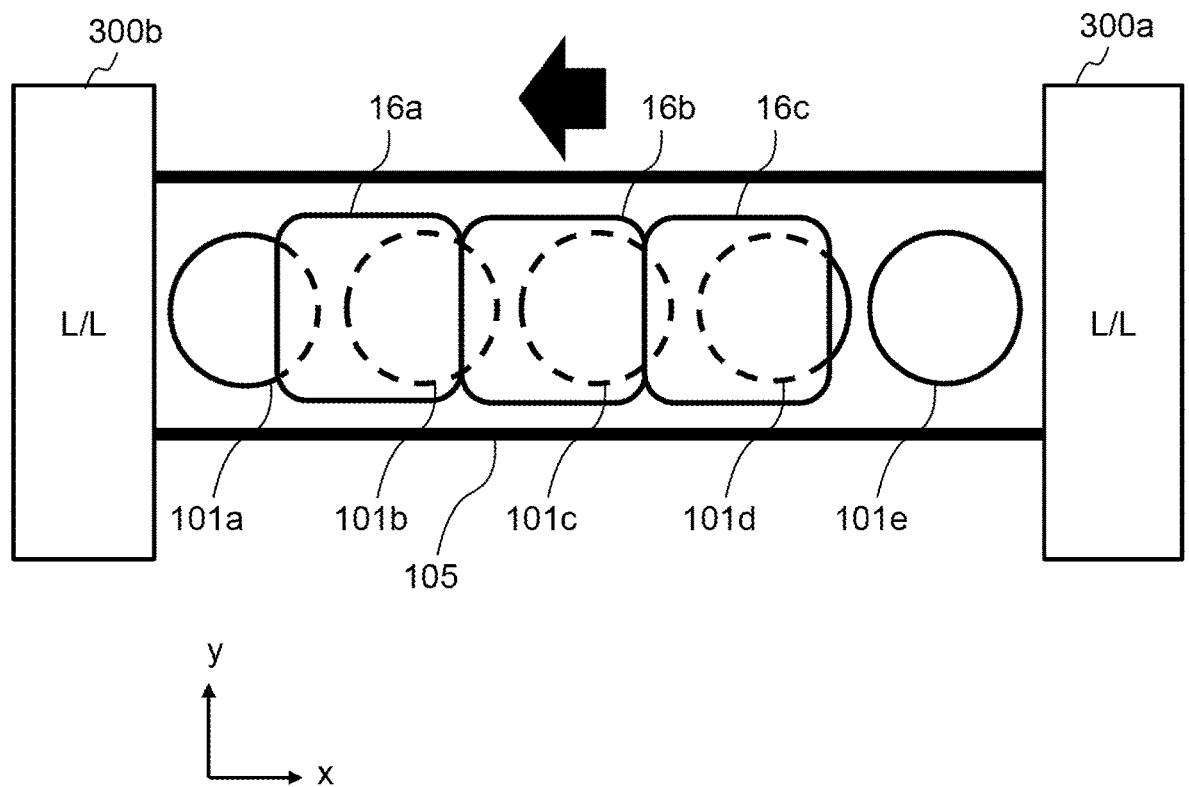
FIG. 16 is a diagram illustrating an example of a method of performing continuous pattern writing on a plurality of substrates according to the first embodiment.

FIG. 16 is a diagram illustrating an example of a method of performing continuous pattern writing on a plurality of substrates according to the first embodiment. In the example of FIG. 16, the stage 105 has a plurality of substrates 101a, 101b, 101c, 101d, 101e arranged side by side in the moving direction (−x direction). Then, by moving the stage 105 in the −x direction, the plurality of substrates 101a, 101b, 101c, 101d, 101e on the stage 105 can be moved in the −x direction. In the example of FIG. 16, the plurality of multiple-beam clusters 16 is arranged in the same direction as the moving direction of the plurality of substrates 101 so that the plurality of substrates 101 sequentially passes through the irradiation region of each of the plurality of multiple-beam clusters 16. The multiple-beam clusters 16 write patterns on mutually different substrates 101 at the same time. In other words, the plurality of multiple-beam sets 12 is arranged in the same direction as the moving direction of the plurality of substrates 101. In this example, there is a case in which the electron beam column included in the adjacent multiple-beam clusters 16 may write different positions of the same substrate 101 or adjacent substrates 101. When the size of the multiple-beam cluster in the stage advancing direction is smaller than the substrate 101, there is a case in which three or more multiple-beam clusters 16 write the same substrate 101. Load-lock (L/L) chamber systems 300a, 300b for loading the substrate 101 into the pattern writing chamber 102 and unloading the substrate 101 out of the pattern writing chamber 102 are arranged in front and behind the moving direction of the stage 105. The plurality of substrates 101a, 101b, 101c, 101d, 101e sequentially loaded from the L/L chamber system 300a to the stage 105 are sequentially moved in the −x direction in accordance with the movement of the stage 105. Each beam belonging to the multiple-beam clusters 16a, 16b, 16c writes an exposure pixel group corresponding to each beam for each small region in each of the substrates 101a, 101b, 101c, 101d, 101e by sequentially moving into its irradiation region. By writing a pattern in this manner, exposure is generally performed by beams belonging to a plurality of multiple-beam clusters 16 for one small region. A plurality of multi-columns continuously writes a pattern on a plurality of substrates 101 while the plurality of substrates 101 moves in the moving direction. Then, the pattern writing processing of each of the substrates 101 is completed by each of the substrates 101 passes through the irradiable region of the plurality of multi-columns (here, three multiple-beam clusters 16a, 16b, 16c). If exposure of all pixels is not completed in one movement, the stage is further reciprocated as many times as necessary to expose all pixels. The substrate 101 on which the pattern writing processing has been completed is sequentially unloaded from the pattern writing chamber 102 to the outside by the L/L chamber system 300b. As described above, by configuring irradiation regions of the plurality of multiple-beam clusters 16a, 16b, 16c aligned in the moving direction so that the plurality of substrates 101 passes therethrough continuously, the pattern writing processing is continuously performed and a large amount of semiconductor substrates can be manufactured. In the first embodiment, the size of the small region 33 is reduced regardless of the number of the chip regions 332 formed on one substrate 101 and by adding the multiple-beam set 12 correspondingly, the throughput can further be improved. Therefore, semiconductor wafers can be mass-produced.

Figure 17:
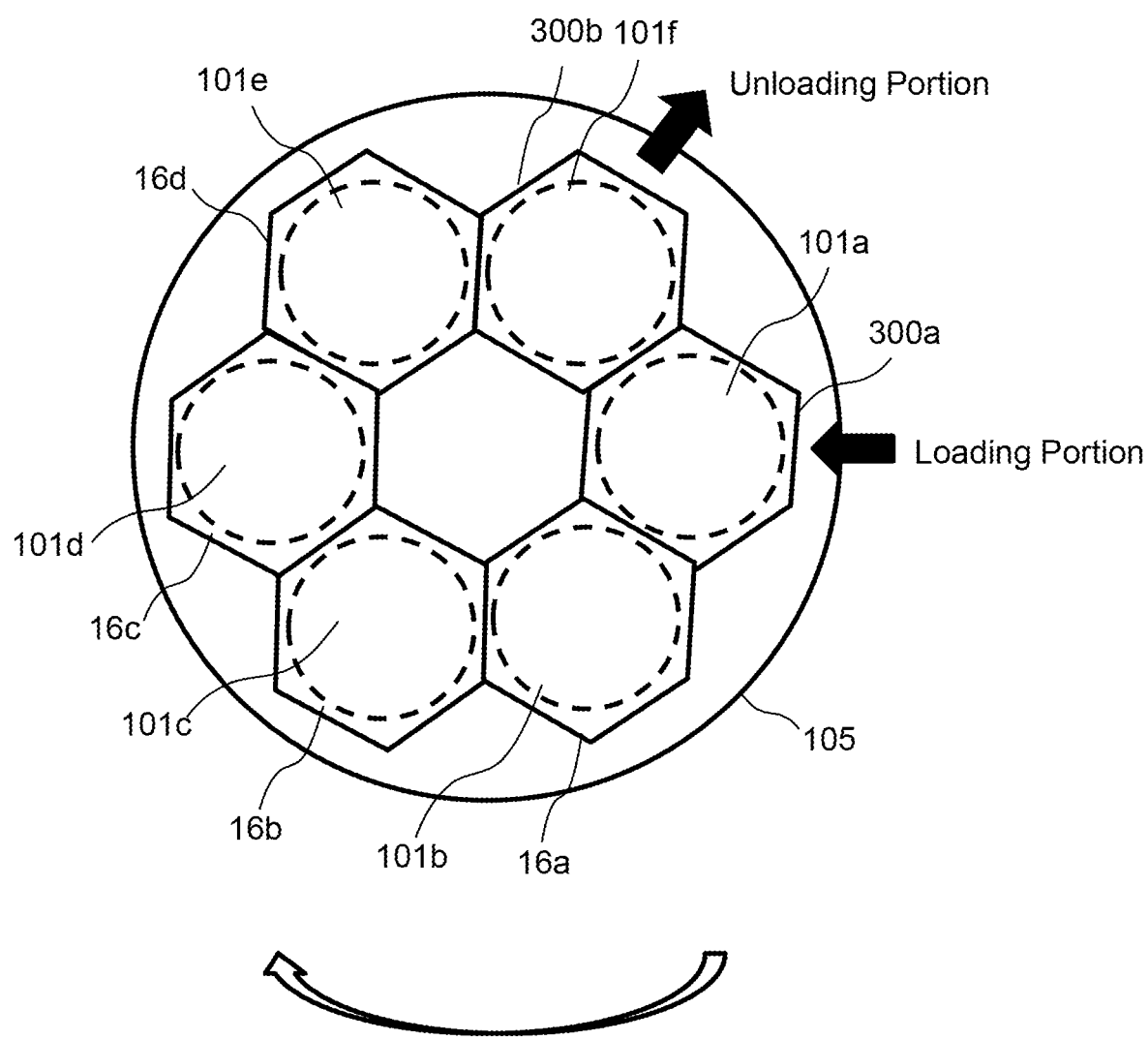
FIG. 17 is a diagram illustrating another example of the method of performing continuous pattern writing on the plurality of substrates according to the first embodiment.

FIG. 17 is a diagram illustrating another example of the method of performing continuous pattern writing on the plurality of substrates according to the first embodiment. In the example of FIG. 17, the stage 105 rotates (θ direction) about the center axis and a plurality of substrates 101a, 101b, 101c, 101d, 101e, 101f is arranged side by side on a circulating track. Then, by rotating the stage 105, the plurality of substrates 101a, 101b, 101c, 101d, 101e, 101f on the stage 105 can continuously be moved along the circulating track. In the example of FIG. 17, a plurality of multiple-beam clusters 16 is arranged along the circulating track of a plurality of substrates 101 so that the plurality of substrates 101 sequentially passes through the irradiation regions of each of the plurality of multiple-beam clusters 16. In other words, the plurality of multiple-beam sets 12 is arranged in the same direction as the moving direction of the plurality of substrates 101. The L/L chamber system 300a for loading each of the substrates 101 into the pattern writing chamber 102 is arranged at one place on the circulating track. Then, the L/L chamber system 300b for unloading each of the substrates 101 from the pattern writing chamber 102 is arranged in front of the L/L chamber system 300a by moving on the circulating track. The plurality of substrates 101a, 101b, 101c, 101d, 101e, 101f sequentially loaded from the L/L chamber system 300a to the stage 105 is sequentially moved on the circulating track in accordance with the movement of the stage 105. Each beam belonging to the multiple-beam clusters 16a, 16b, 16c, 16d writes an exposure pixel group corresponding to each beam for each small region in each of the substrates 101a, 101b, 101c, 101d, 101e, 101f by sequentially moving into its irradiation region. In the example of FIG. 17, pattern writing processing of each of the substrates 101 is started from the location (predetermined location) of the multiple-beam cluster 16a on the circulating track and a plurality of multi-columns (here, multiple-beam clusters 16a, 16b, 16c, 16d) writes a pattern on the plurality of substrates 101 such that the pattern writing processing of each of the substrates 101 is completed before each of the substrates 101 returns to a location (in front of the predetermined location) of the multiple-beam cluster 16d by moving on the circulating track. In other words, a plurality of multi-columns (here, four multiple-beam clusters 16a, 16b, 16c, 16d) writes a pattern on a plurality of substrates so that the pattern writing processing of each of the substrates 101 is completed by the time when each of the substrates 101 makes one turn on the circulating track. Further in other words, each of the plurality of multiple-beam clusters 16 writes a pattern on a different one of substrates 101 at the same time. By a pattern being written by the multiple-beam clusters 16a, 16b, 16c, 16d in this manner, exposure is generally performed by beams belonging to a plurality of multiple-beam clusters 16 for one small region. A plurality of multi-columns continuously writes a pattern on a plurality of substrates 101 while the plurality of substrates 101 moves in the moving direction. Then, the pattern writing processing of each of the substrates 101 is completed by each of the substrates 101 passing through the irradiable region of the plurality of multi-columns (here, four multiple-beam clusters 16a, 16b, 16c, 16d). If exposure of all pixels is not completed in one rotation, the stage is further rotated as many times as necessary to expose all pixels. In other words, the plurality of multiple-beam sets 12 writes a pattern on a plurality of substrates 101 so that the pattern writing processing of each of the substrates 101 is completed by the time when each of the substrates 101 makes one turn or a plurality of turns on the circulating track.

In a state where the plurality of substrates 101 is continuously moved in the predetermined direction, each multiple-beam set 12 sequentially writes a portion of the pattern on a different one or more of exposure pixel groups in a same small region on a same substrate 101. The small region is smaller than each die region 332 of a plurality of die regions 332 to form a same pattern, and the plurality of die regions is provided on each substrate 101 of the plurality of substrates. The substrate 101 on which the pattern writing processing has been completed is sequentially unloaded from the pattern writing chamber 102 to the outside by the L/L chamber system 300b. As described above, by configuring irradiation regions of the plurality of multiple-beam clusters 16a, 16b, 16c, 16d aligned in the moving direction so that the plurality of substrates 101 passes therethrough continuously, the pattern writing processing is continuously performed and a large amount of semiconductor substrates can be manufactured. In the first embodiment, the size of the small region 33 is reduced regardless of the number of the chip regions 332 formed on one substrate 101 and by adding the multiple-beam set 12 correspondingly, the throughput can further be improved. Therefore, semiconductor wafers can be mass-produced. The number of pixels that can be exposed can be increased by makes a plurality of turns. At this point, it is desirable to suppress an increase in exposure time by increase the rotation speed in accordance with the number of turns.

Figure 18:
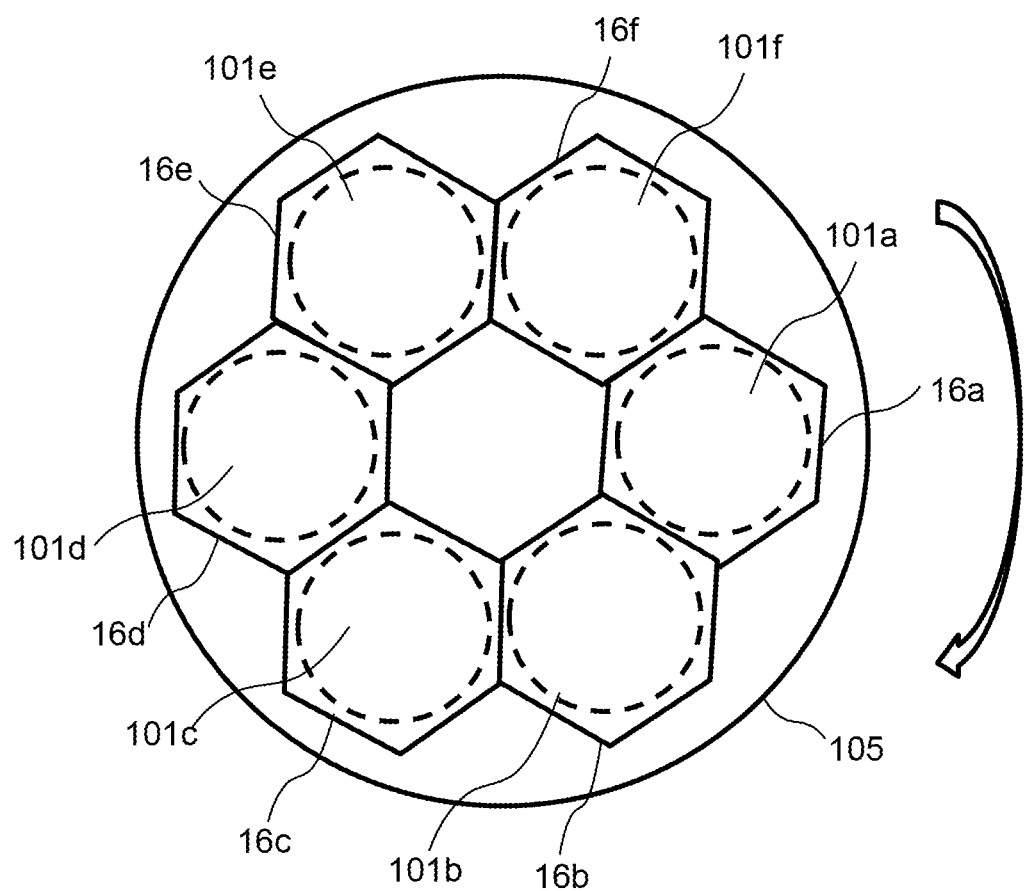
FIG. 18 is a diagram illustrating still another example of the method of performing continuous pattern writing on the plurality of substrates according to the first embodiment.

FIG. 18 is a diagram illustrating still another example of the method of performing continuous pattern writing on the plurality of substrates according to the first embodiment. In the example of FIG. 17, the case where the L/L chamber systems 300a, 300b for loading/unloading the substrate 101 are arranged on the circulating track has been described, but the present embodiment is not limited thereto. In the example of FIG. 18, the multiple-beam cluster 16 is arranged also in the arrangement locations of the L/L chamber system 300a, 300b for loading/unloading the substrate 101 on the circulating track. Thus, for example, six multiple-beam clusters 16a, 16b, 16c, 16d, 16e, 16f can be arranged on the same circulating track. The L/L chamber systems 300a, 300b may be arranged at locations deviating from the circulating track. Alternatively, six substrates 101 may first be loaded into the irradiatable regions of the six multiple-beam clusters 16a, 16b, 16c, 16d, 16e, 16f and then, the stage 105 may be rotated. Then, pattern writing processing of each of the substrates 101 is started from the multiple-beam cluster (for example, the multiple-beam cluster 16a) where each of the substrates 101 is first arranged and a plurality of multi-columns (here, multiple-beam clusters 16a, 16b, 16c, 16d, 16e, 16f) writes a pattern on the plurality of substrates 101 such that the pattern writing processing of each of the substrates 101 is completed before each of the substrates 101 returns to the last multiple-beam cluster (for example, the multiple-beam cluster 16f) by moving on the circulating track. In other words, a plurality of multi-columns (here, six multiple-beam clusters 16a, 16b, 16c, 16d, 16e, 16f) writes a pattern on the plurality of substrates 101 so that the pattern writing processing of each of the substrates 101 is completed by the time when each of the substrates 101 makes one turn on the circulating track. Since the number of beams is larger than in the example of FIG. 17, the throughput can be further improved. In this case as well, when exposure of all pixels is not completed by one rotation, the stage is further rotated as many times as necessary to expose all pixels.

In the examples of FIGS. 17 and 18, the plurality of substrates 101 moves along the circulating track, but each of the substrates 101 may be turned so as to rotate along with the movement on the circulating track. By rotating the substrate, it is possible to increase the types of electron beam columns that irradiate other pixels in the vicinity of each pixel on the substrate with an electron beam and the deviations of electron beam column characteristics in the apparatus can thereby be averaged. In this case, since the phase of the arrangement of the electron beam column and the arrangement of pixels on the substrate change with time, it is impossible to perform stage tracking in a strict sense, but the change of phase shifts is slower than the exposure time of one pixel and so is negligible because the influence thereof on an exposure amount distribution error is small. Further, when allocating the exposure amount to each electron beam column, the accuracy of the exposure distribution control can further be increased by considering an error of stage tracking due to the phase shift.

Figure 19:
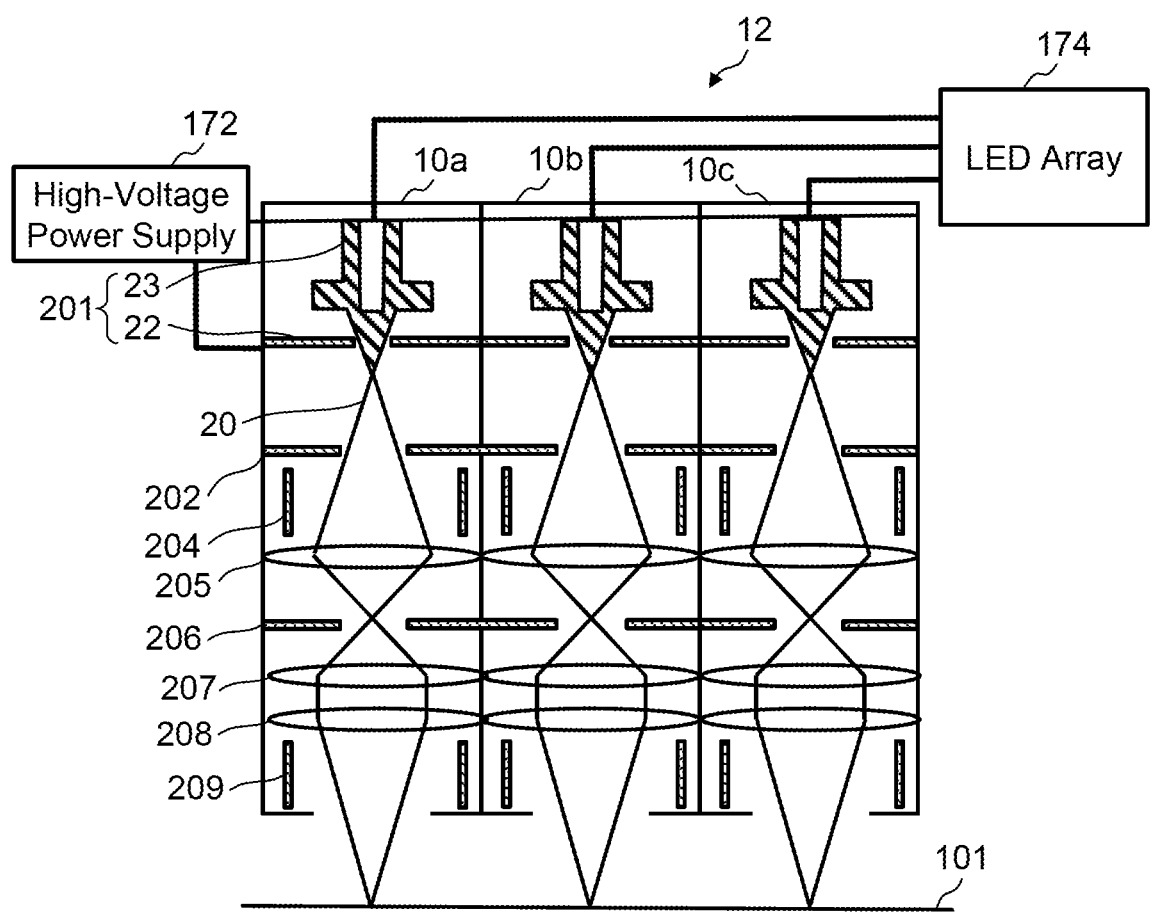
FIG. 19 is a diagram showing another example of the internal configuration of the electron beam column according to the first embodiment.

FIG. 19 is a diagram showing another example of the internal configuration of the electron beam column according to the first embodiment. FIG. 19 shows an example in which the downstream electrostatic lens has two stages (207, 208) and the deflector 209 is arranged closer to the target object side than the downstream electrostatic lens. In the example of FIG. 19, a case where a photoelectron source is used as the electron gun assembly 201 in each of the electron beam columns 10a, 10b, 10c, . . . . Other configurations are the same as in FIG. 8. It should be noted that the scales and the like are not matched between FIG. 19 and FIG. 8. In the photoelectron source, an acceleration voltage is applied from a high-voltage power supply 172 in the power supply circuit 170 to between an emitter 23 of which tip is pointed and an extraction electrode (anode) 22 and also ultraviolet light is irradiated (excited) from an LED array circuit 174 in the relay circuit 180 (or the power supply circuit 170) to the rear side of the emitter 23 to emit the electron beam 20 from the emitter 23. Because a supply voltage is applied to the plurality of electron gun assemblies 201 from the same power supply circuit 170 (or the same relay circuit 180) and also ultraviolet light is irradiated from the same relay circuit 180 (or the same power supply circuit 170), the numbers of power supply systems and control systems can be greatly reduced as compared with the number of beams. However, the present embodiment is not limited to such a case. The electron gun assemblies 201 may be ON/OFF controlled individually. Unlike the case where multiple beams are formed from a beam emitted from one electron gun assembly, the electron gun assembly 201 of each of the electron beams 20 is different and thus, an increase in output of each of the electron gun assemblies 201 is not dispersed to a plurality of beams so that the amount of current per beam can be greatly increased. Therefore, if the amount of current from each of the electron gun assemblies 201 is increased, the current amount of the entire multiple beams can be greatly increased. Therefore, the amount of current per unit area increases and the dose amount per unit time can be increased correspondingly. Therefore, the beam irradiation time for giving the dose amount necessary for resolving the resist on the substrate 101 can be greatly shortened, and the throughput can be improved.

Figure 20:
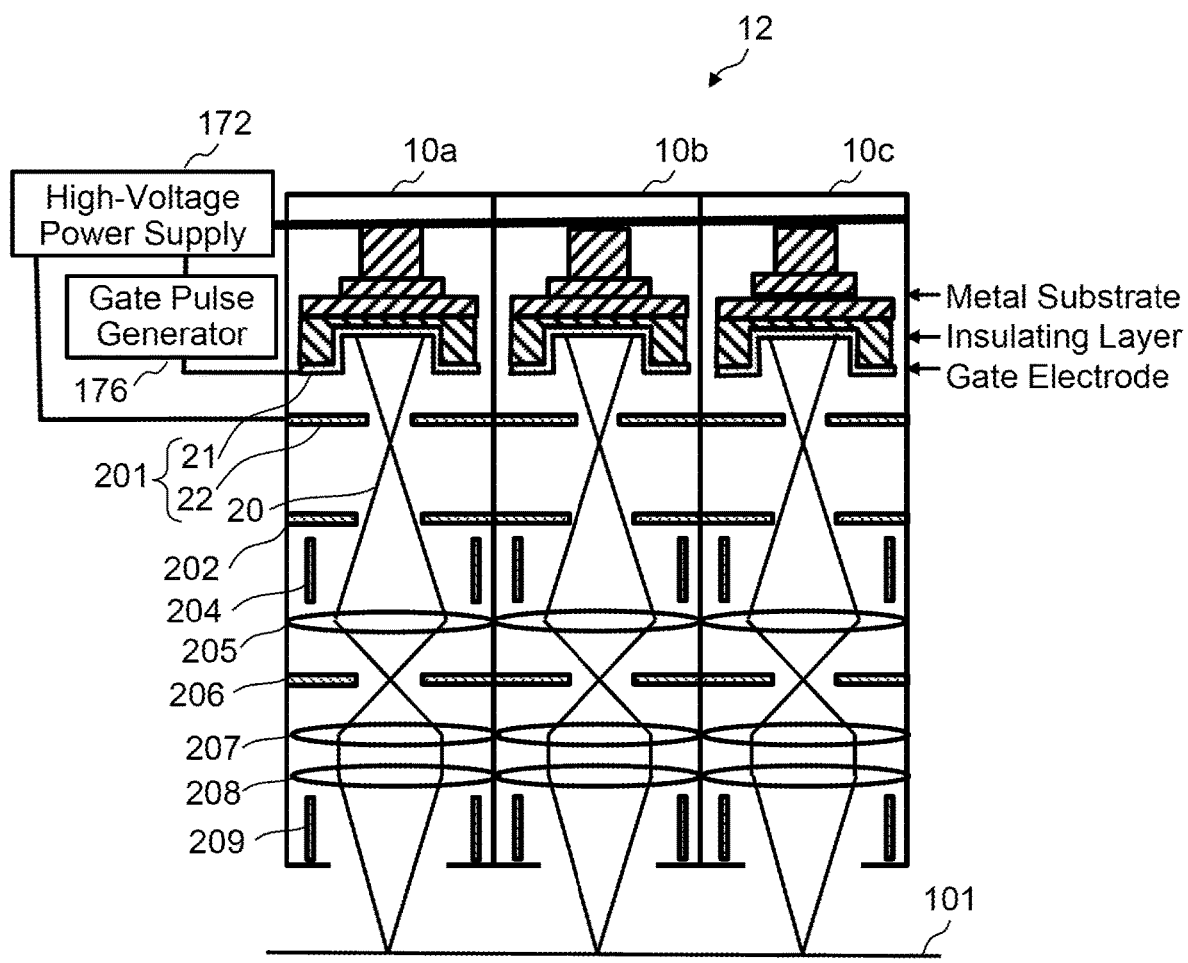
FIG. 20 is a diagram showing still another example of the internal configuration of the electron beam column according to the first embodiment.

FIG. 20 is a diagram showing still another example of the internal configuration of the electron beam column according to the first embodiment. In the example of FIG. 20, a case where an MIM (metal-insulator-metal) type electron source is used as the electron gun assembly 201 in the electron beam columns 10a, 10b, 10c, . . . . Other configurations are the same as in FIG. 8. It should be noted that the scales and the like are not matched between FIG. 20 and FIG. 8. In the MIM type electron source, an acceleration voltage is applied from the high-voltage power supply 172 in the power supply circuit 170 to between an emitter 21 and the extraction electrode (anode) 22 and also a voltage is applied from the high-voltage power supply 172 to between an upper electrode and a lower electrode (gate electrode) of the emitter 21 to emit the electron beam 20 from the emitter 21. A gate pulse generator 176 may be arranged between the high-voltage power supply 172 and the lower electrode (gate electrode) to output a pulse signal so that the electron gun assemblies 201 may be ON/OFF controlled individually. Because a supply voltage is applied to the plurality of electron gun assemblies 201 from the same power supply circuit 170 (or the same relay circuit 180), the numbers of power supply systems and control systems can be greatly reduced as compared with the number of beams. Also, unlike the case where multiple beams are formed from a beam emitted from one electron gun assembly, the electron gun assemblies 201 of the respective electron beams 20 are different and so an increase in output of each of the electron gun assemblies 201 is not dispersed into a plurality of beams and the amount of current per beam can be greatly increased. Therefore, if the amount of current from each of the electron gun assemblies 201 is increased, the current amount of the entire multiple beams can be greatly increased. Therefore, the amount of current per unit area increases and so the amount of dose per unit time can be increased correspondingly, as in the case described above.

Figure 21:
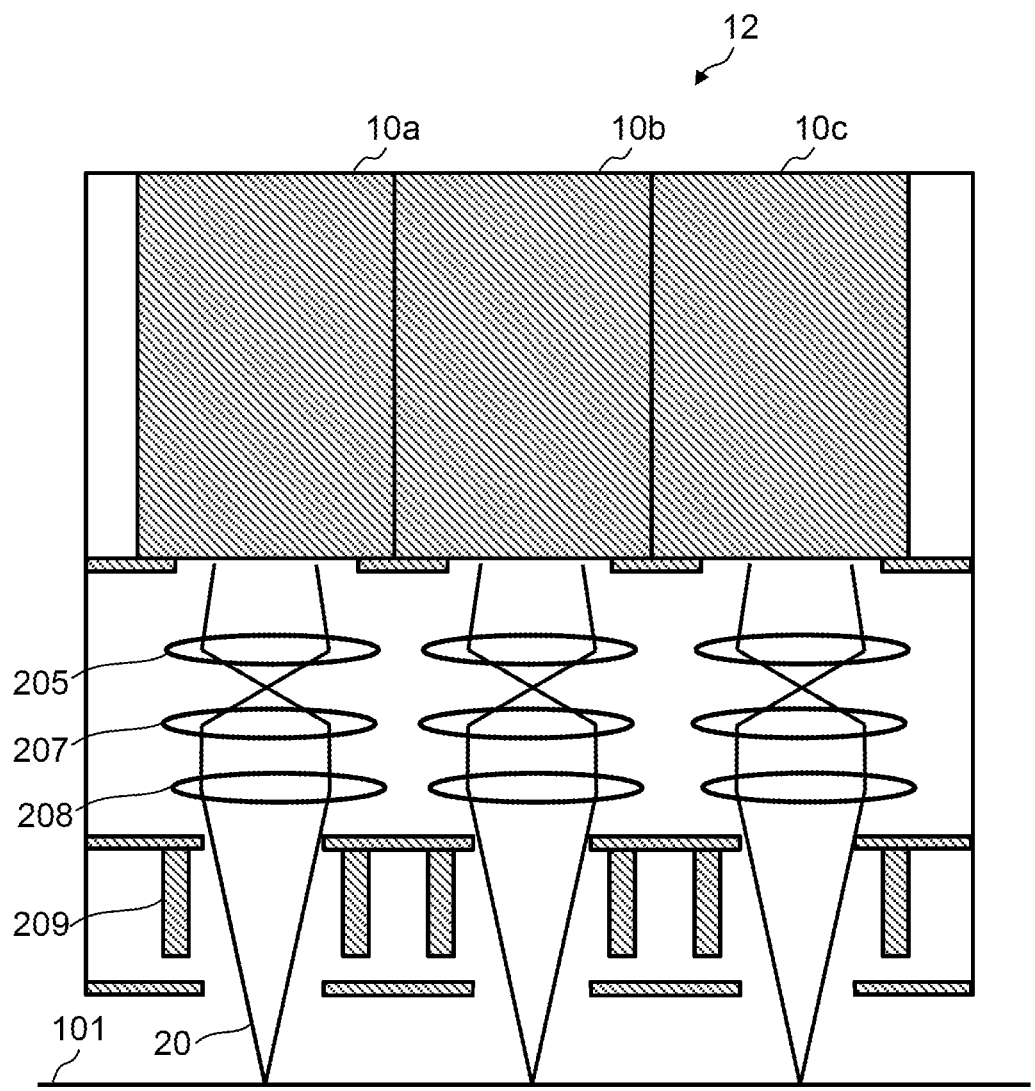
FIG. 21 is a diagram showing still another example of the internal configuration of the electron beam column according to the first embodiment.

FIG. 21 is a diagram showing still another example of the internal configuration of the electron beam column according to the first embodiment. In the above example in FIG. 8 and the like, the case where the electron gun assembly 201, the limiting aperture plate substrate 202, the blanking deflector 204, the electrostatic lens 205, the limiting aperture plate substrate 206, the electrostatic lens 207, the electrostatic lens 208, and the objective deflector 209 are arranged in, for example, a cylindrical electron optical barrel (electron beam column 10), but the present embodiment is not limited thereto. In the example of FIG. 21, the electron gun assembly 201, the limiting aperture plate substrate 202, and the blanking deflector 204 are arranged in, for example, a single cylindrical electron optical barrel (electron beam column 10), and the electrostatic lens 205, the limiting aperture plate substrate 206, the electrostatic lens 207, the electrostatic lens 208, and the objective deflector 209 are arranged for each beam in a common space in the multiple-beam set 12. In the example of FIG. 21, an illustration of the limiting aperture plate substrate 206 is omitted. With such a configuration, each of the electrostatic lenses 205 in the multiple-beam set 12 can be formed of a common substrate. Likewise, each of the electrostatic lenses 207 in the multiple-beam set 12 can be formed of a common substrate. Likewise, each of the electrostatic lenses 208 in the multiple-beam set 12 can be formed of a common substrate. Further, each of the objective deflectors 209 in the multiple-beam set 12 can be arranged on a common substrate. Therefore, the multiple-beam set 12 can be formed more easily.

Figure 22:
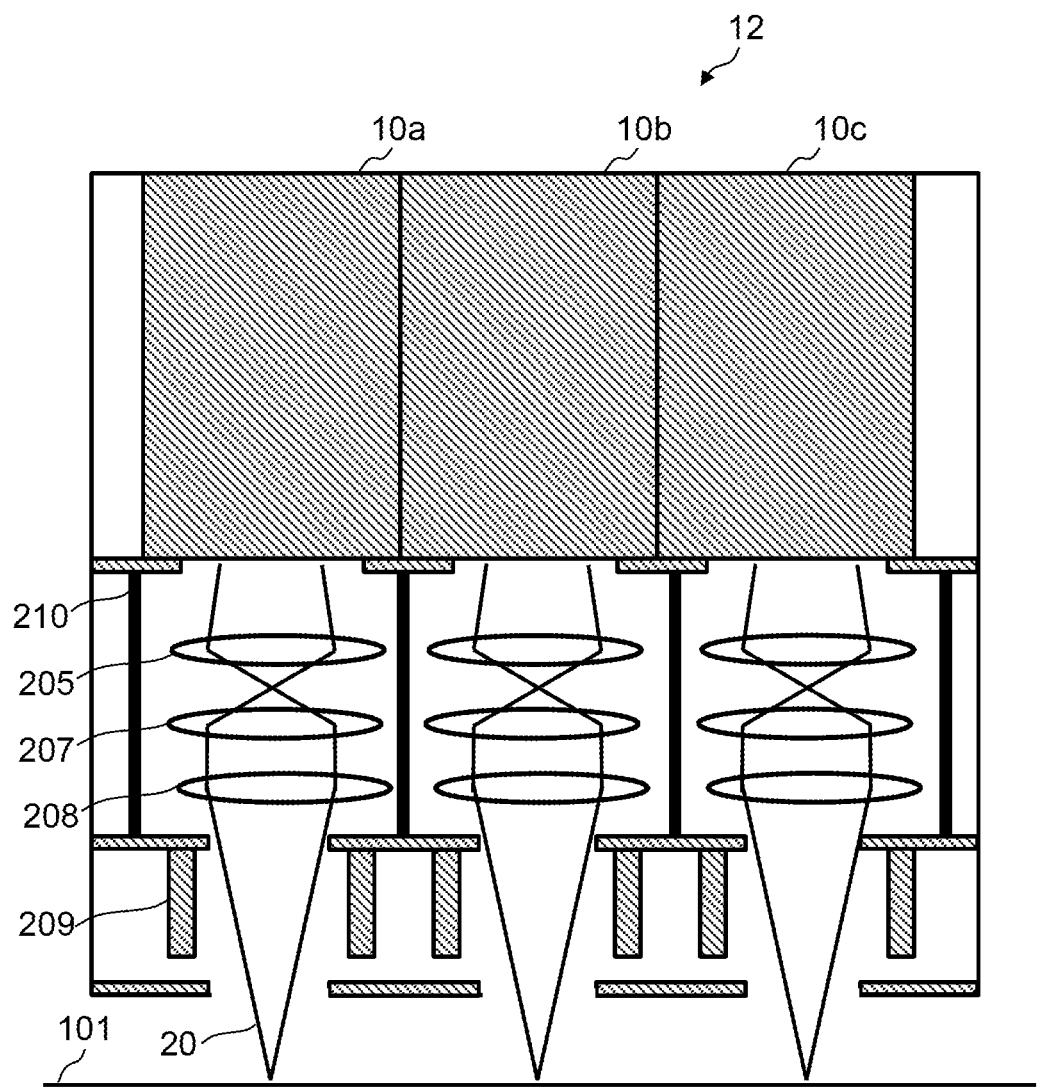
FIG. 22 is a diagram showing still another example of the internal configuration of the electron beam column according to the first embodiment.

FIG. 22 is a diagram showing still another example of the internal configuration of the electron beam column according to the first embodiment. In the example of FIG. 22, a case where a partition wall 210 is arranged between beams in the arrangement space of the electrostatic lenses 205, 207, 208, in addition to the configuration in FIG. 21, is shown. By arranging the partition walls 210 between beams, an electric field generated by the electrostatic lenses can be prevented from affecting adjacent beams. Because the partition wall is intended for electric field shielding, evacuation efficiency can be increased by using, for example, a grid structure.

Figure 23:
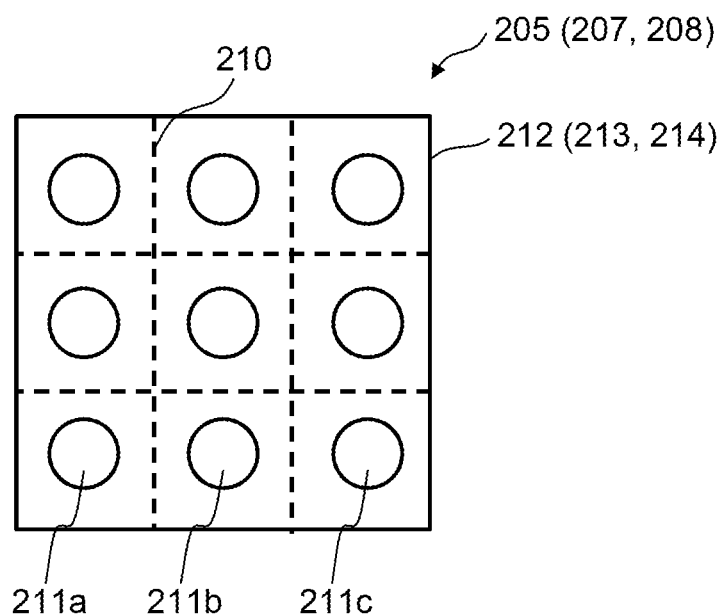
FIG. 23 is a top view showing an example of an electrostatic lens array according to the first embodiment.

FIG. 23 is a top view showing an example of an electrostatic lens array according to the first embodiment.

Figure 24:
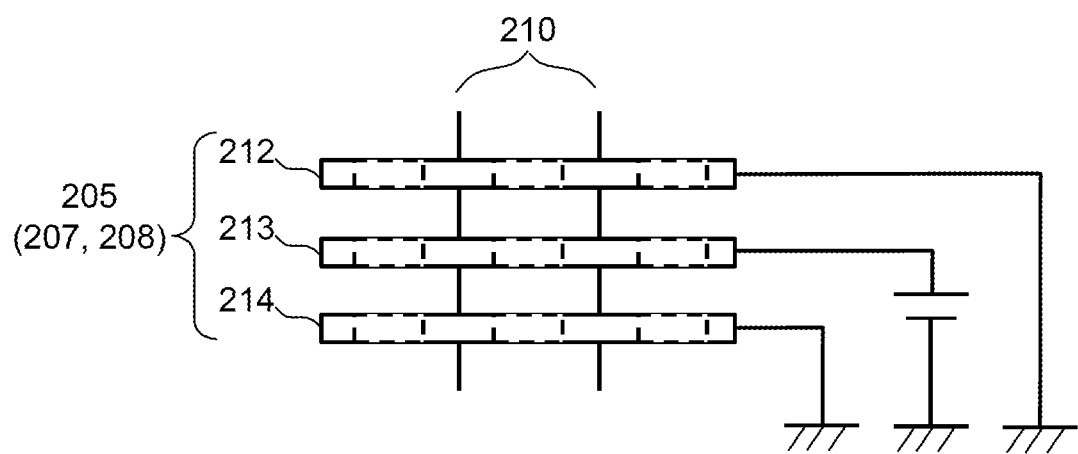
FIG. 24 is a sectional view showing an example of the electrostatic lens array according to the first embodiment.

FIG. 24 is a sectional view showing an example of the electrostatic lens array according to the first embodiment. As shown in FIGS. 23 and 24, each of the electrostatic lenses 205, 207, 208 is formed of a common substrate 212 (213, 214) in the multiple-beam set 12. Each passing hole 211 is formed at each beam passing position in such a common substrate. In the example of FIG. 23, for example, when the multiple-beam set 12 is configured by the configuration necessary for forming 3×3 beams, 3×3 through holes 211 are formed. Besides, the electrostatic lenses 205, 207 and 208 are all formed of three stages of electrodes. In the example of FIG. 24, in the multiple-beam set 12, the electrostatic lens array is formed of common three-stage substrates 212, 213, 214. By applying the ground potential to the upper and lower common substrates 212, 214 and adjusting the potential applied to the middle common substrate 213, the lens action for each beam in the multiple-beam set 12 is controlled to be supplied. When, as shown in the example of FIG. 22, the partition walls 210 are arranged between the beams, as shown in FIGS. 23 and 24, a plurality of partition walls 210 may be arranged in a grid pattern.

Next, the operation of actual pattern writing processing using pattern writing data input from outside the lithography apparatus 100 and stored in the storage device 140 will be described step by step.

As an area ratio map creation process (rasterization process), a rasterization unit 50 reads pattern writing data from the storage device 140 and calculates a pattern area density p' in a pixel for each of a plurality of pixels (irradiation unit regions) obtained by dividing a pattern writing region of the substrate 101 by a size equal to, for example, a beam size into a mesh shape. The processing is performed for, for example, each of the chip regions 332.

As a dose calculation process, the dose calculation unit 52 first virtually divides the pattern writing region (here, for example, the chip region 332) by a predetermined size into a plurality of proximity mesh regions (mesh region for proximity effect correction calculation) in a mesh shape. The size of the proximity mesh region is suitably set to about 1/10 of the range of influence of the proximity effect, for example, about 1 μm. The dose calculation unit 52 reads the pattern writing data from the storage device 140 and calculates the pattern area density p of the pattern arranged in the relevant proximity mesh region for each proximity mesh region.

Next, the dose calculation unit 52 calculates a proximity effect correction irradiation coefficient Dp (x) (corrected dose) to correct the proximity effect for each proximity mesh region. The unknown proximity effect correction irradiation coefficient Dp (x) can be defined by a threshold model for proximity effect correction similar to the conventional approach using the backscattering coefficient η, the dose threshold value Dth of the threshold model, the pattern area density p, and the distribution function g (x).

Next, the dose calculation unit 52 calculates an incident dose D (x) (dose amount) to irradiate the relevant pixel for each pixel. For example, the incident dose D (x) may be calculated as a value obtained by multiplying the preset reference dose Dbase by the proximity effect correction irradiation coefficient Dp and the pattern area density ρ'. The reference dose Dbase can be defined by, for example, Dth/(½+η). From the above, the desired incident dose D (x) corrected for the proximity effect based on the layout of a plurality of figure patterns defined in the pattern writing data can be obtained.

Then, the dose calculation unit 52 creates a beam irradiation time data map defining the beam irradiation time for each pixel obtained by converting the incident dose D (x) for each pixel into the beam irradiation time t gradated in the predetermined quantization unit A. The created beam irradiation time data map is stored in, for example, the storage device 142.

As a beam irradiation time data processing process, a beam irradiation time data processing unit 54 reads and rearranges the beam irradiation time data map in the order of shots according to the pattern writing sequence in the first embodiment. Then, the beam irradiation time data is transferred to the deflection control circuit 130 in the order of shots.

As a pattern writing process, the deflection control circuit 130 outputs a blanking control signal to each of the blanking deflectors 204 in the order of shots via the relay circuit 184 and also outputs a deflection control signal to the DAC amplifier 132 in the order of shots. Then, while the stage 105 is continuously moved under the control of the stage drive circuit 139, the pattern writing mechanism 150 writes a pattern on the substrate 101 using a bundle (multiple beams) of the electron beam 20 irradiated from each of the electron beam columns 10.

According to the first embodiment, as described above, the multiple-beam cluster 16, the multiple-beam block 14, the multiple-beam set 12, and the multi-column are unitized for each layer and thus, it is easy to add such units as necessary and the total electron beam current can be increased. Further, according to the first embodiment, the irradiation region of the respective multiple-beam sets 12 is divided by the small region 33 smaller than the chip region 332 and thus, the multiple-beam cluster 16, the multiple-beam block 14, or the multiple-beam set 12 that is unitized can be expanded according to the required throughput. Further, according to the first embodiment, a plurality of substrates 101 can be sequentially passed through the irradiation region of each of the multiple-beam clusters 16 that are formed as a production line. Therefore, throughput of multiple-beam pattern writing can be improved and semiconductor substrates (wafers) can be mass-produced.

When writing an LSI pattern on a wafer, overlay accuracy becomes important. In this connection, for example, the overlay accuracy can be secured by doing as follows. First, at least three alignment marks are provided on each wafer. Then, after mounting the wafers on the stage, the wafers are moved and the stage is operated and if a certain wafer is focused on, the wafer is moved to a plurality of positions (referred to as stage positions), and at each stage position, the position and orientation of the wafer are measured. The measurement can be made by, for example, providing a plurality of optical microscopes between the multiple-beam clusters 16. Further, a portion of the electron beam column can be operated for measurement to determine the mark position from a reflected electron signal obtained by irradiating the mark with an electron beam. Further, the height of the mark is determined using a z sensor using an optical lever. Based on the position, orientation, and height of each wafer at each stage position thus obtained, pattern writing data is corrected and written. Further, accuracy can be improved by arranging many marks at the boundary of, for example, a die, measuring high order distortion, and correcting the pattern writing data based on the measurement. The measurement is made prior to pattern writing, and in that case, the stage is moved at the same speed as the pattern writing speed. Also, by making the stage speed faster than the pattern writing speed, the time taken for measurement can be shortened.

In the foregoing, an embodiment has been described with reference to concrete examples. However, the present disclosure is not limited to these concrete examples. In the above example, for example, the case where the objective deflector 209 uses one-stage deflection is shown, but the present embodiment is not limited thereto. The objective deflector 209 may use multistage deflection of two or more stages.

Portions of the apparatus configuration, the control method and the like that are not needed directly for the description of the present disclosure are omitted, but a necessary apparatus configuration and a necessary control method can be appropriately selected and used. For example, a control unit configuration that controls the lithography apparatus 100 is not described, but a necessary control unit configuration is appropriately selected and used, as a matter of course.

In addition, all charged particle beam lithography apparatuses and charged particle beam pattern writing methods including elements of the present disclosure and the design of which can appropriately be changed by a person skilled in the art are included in the scope of the present disclosure.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam pattern writing method comprising:
    continuously moving a plurality of substrates aligned in a predetermined direction in the predetermined direction; and
    writing a pattern on the plurality of substrates by using a plurality of multiple-beam sets, each irradiating multiple beams, so that each multiple-beam set of the plurality of multiple-beam sets sequentially writes a portion of the pattern on a different one or more of exposure pixel groups in a same small region, on a same substrate, smaller than each die region of a plurality of die regions to form a same pattern, the plurality of die regions provided on each substrate of the plurality of substrates, in a state where the plurality of substrates is continuously moved in the predetermined direction.

2. The method according to claim 1, wherein
    the plurality of substrates continuously moves along a circulating track,
    the plurality of multiple-beam sets is arranged along the circulating track, and
    the plurality of multiple-beam sets writes a pattern on the plurality of substrates such that pattern writing processing of the each substrate is completed by a time when each substrate makes one turn or a plurality of turns on the circulating track.

* * * * *